(12) United States Patent
Toyama et al.

(10) Patent No.: US 12,191,173 B2
(45) Date of Patent: Jan. 7, 2025

(54) WIRE TENSION ADJUSTMENT METHOD AND WIRE TENSION ADJUSTER

(71) Applicant: SHINKAWA LTD., Tokyo (JP)

(72) Inventors: Toshihiko Toyama, Tokyo (JP); Yuu Hasegawa, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 0 days.

(21) Appl. No.: 18/026,589

(22) PCT Filed: Oct. 21, 2021

(86) PCT No.: PCT/JP2021/038988
§ 371 (c)(1),
(2) Date: Mar. 15, 2023

(87) PCT Pub. No.: WO2023/067776
PCT Pub. Date: Apr. 27, 2023

(65) Prior Publication Data
US 2024/0297055 A1   Sep. 5, 2024

(51) Int. Cl.
*B23K 20/00* (2006.01)
*H01L 21/67* (2006.01)

(52) U.S. Cl.
CPC ...... *H01L 21/67138* (2013.01); *B23K 20/004* (2013.01); *B23K 20/005* (2013.01); *H01L 21/67092* (2013.01); *H01L 21/67259* (2013.01)

(58) Field of Classification Search
CPC ......... H01L 21/67138; H01L 21/67092; H01L 21/67259; B23K 20/004; B23K 20/005; B23K 20/007

USPC ....................................... 228/180.5, 4.5, 904
See application file for complete search history.

(56) References Cited

U.S. PATENT DOCUMENTS

| 5,037,023 A * | 8/1991 | Akiyama ................ H01L 24/85 228/180.5 |
| 2002/0027152 A1 * | 3/2002 | Ushiki ................ B23K 20/004 228/8 |
| 2014/0209663 A1 * | 7/2014 | Song ...................... H01L 24/78 228/1.1 |
| 2016/0365331 A1 | 12/2016 | Takagi |

(Continued)

FOREIGN PATENT DOCUMENTS

| CN | 101246827 A * | 8/2008 | .......... B08B 7/0035 |
| EP | 0945208 A2 * | 9/1999 | |
| JP | H10254947 | 2/1990 | |

(Continued)

OTHER PUBLICATIONS

"International Search Report (Form PCT/ISA/210) of PCT/JP2021/038988," mailed on Jan. 25, 2022, pp. 1-3.

(Continued)

*Primary Examiner* — Kiley S Stoner
(74) *Attorney, Agent, or Firm* — JCIPRNET

(57) ABSTRACT

Provided is a wire tension adjuster (60) that adjusts tension (T) applied to a wire (18) of a wire bonding apparatus (100). In the wire tension adjuster (60), in a state in which the wire (18) is gripped by a wire clamper (17), air is supplied to a wire tensioner (40) and a height position (H) of a tip (14*f*) of a bonding arm (14) is detected, and a flow rate (G) of the air supplied to the wire tensioner (40) is adjusted based on the height position (H) detected, thereby adjusting the tension (T) applied to the wire (18).

14 Claims, 17 Drawing Sheets

(56) References Cited

U.S. PATENT DOCUMENTS

2020/0203307 A1    6/2020  Tei

FOREIGN PATENT DOCUMENTS

| | | | | |
|---|---|---|---|---|
| JP | H05152370 A | * | 6/1993 | |
| JP | H06295933 A | * | 10/1994 | |
| JP | 07283264 A | * | 10/1995 | ........... B23K 20/005 |
| JP | 08031857 A | * | 2/1996 | ............ H01L 24/78 |
| JP | 11233551 A | * | 8/1999 | ............ H01L 24/78 |
| JP | H11312707 | | 11/1999 | |
| JP | H11312707 A | * | 11/1999 | |
| JP | 2001168138 A | * | 6/2001 | ............ H01L 24/78 |
| JP | 3962599 B2 | * | 8/2007 | |
| JP | 2009152480 | | 7/2009 | |
| JP | 2010129588 A | * | 6/2010 | |
| JP | 6149235 | | 6/2017 | |
| WO | WO-2008057091 A1 | * | 5/2008 | ........... B23K 20/004 |
| WO | WO-2010050929 A1 | * | 5/2010 | ........... B23K 20/007 |
| WO | WO-2010062289 A1 | * | 6/2010 | ........... B23K 20/004 |
| WO | WO-2011077681 A1 | * | 6/2011 | ........... B23K 20/005 |
| WO | WO-2015125672 A1 | * | 8/2015 | ........... B23K 20/004 |
| WO | 2018168888 | | 9/2018 | |

OTHER PUBLICATIONS

"Office Action of Korea Counterpart Application No. 10-2023-7009862", issued on Nov. 4, 2024, with English translation thereof, p. 1-p. 10.

* cited by examiner

WIRE TENSION ADJUSTMENT METHOD AND WIRE TENSION ADJUSTER

CROSS-REFERENCE TO RELATED APPLICATION

This application is a 371 application of the International PCT application serial no. PCT/JP2021/038988, filed on Oct. 21, 2021. The entirety of the above-mentioned patent application is hereby incorporated by reference herein and made a part of this specification.

TECHNICAL FIELD

The present disclosure relates to a method for adjusting tension applied to a wire of a wire bonding apparatus, and a configuration of a wire tension adjuster.

RELATED ART

A wire bonding apparatus is used in which an electrode of a semiconductor chip and an electrode of a substrate are connected by a metal wire. In the wire bonding apparatus, a wire tensioner is used that provides predetermined tension to the wire during bonding. The wire tensioner is provided with a wire passage through which the wire passes from a spool side to a capillary side. By causing air to flow upward through the wire passage and pulling the wire upward with the upward airflow, the tension is applied to the wire (see, for example, Patent Document 1).

PRIOR-ART DOCUMENTS

Patent Documents

Patent Document 1: Japanese Patent No. 6149235

SUMMARY OF THE INVENTION

Problems to be Solved by the Invention

The tension applied to the wire by the wire tensioner varies with a flow rate of the air. The tension increases as the flow rate increases; the tension decreases as the flow rate decreases.

In wire bonding, it is necessary to adjust wire tension to a predetermined magnitude in order to form a wire loop of a predetermined shape. This adjustment is often made by flowing air through the wire tensioner with one end of the wire fixed to an electronic balance and measuring a relationship between the flow rate of the air and the tension applied to the wire.

However, after the wire tensioner is incorporated into the wire bonding apparatus, it may be difficult to attach the electronic balance to the wire bonding apparatus and measure the wire tension. In this case, it is necessary to remove the wire tensioner for tension adjustment, and a problem arises that the tension adjustment may take time and effort.

Accordingly, an object of the present disclosure is to easily adjust tension applied to a wire in a state in which a wire tensioner has been incorporated into a wire bonding apparatus.

Means for Solving the Problems

A wire tension adjustment method according to the present disclosure is for adjusting tension applied to a wire of a wire bonding apparatus. The wire bonding apparatus includes: a bonding arm, rotatably attached to a bonding head and having a tip movable in an up-down direction; a wire clamper, attached to the bonding arm, gripping and releasing the wire inserted through a bonding tool held by the tip; a wire tensioner, applying tension to the wire by an airflow; an air flow detector, detecting a flow rate of air supplied to the wire tensioner; a height position detector, detecting a height position of the tip of the bonding arm; and a spring member, generating a rotational moment in a direction opposite to a rotation direction of the bonding arm. The wire tension adjustment method is characterized by including the following. In a height position detection step, air is supplied to the wire tensioner in a state in which the wire is gripped by the wire clamper, and the height position of the tip of the bonding arm where a rotational moment in the rotation direction of the bonding arm due to tension of the wire and the rotational moment in the direction opposite to the rotation direction of the bonding arm due to the spring member balance each other is detected by the height position detector. In an adjustment step, by adjusting the flow rate of the air supplied to the wire tensioner based on the height position detected, the tension applied to the wire is adjusted.

In this way, in the wire tension adjustment method according to the present disclosure, since the height position of the tip of the bonding arm is detected, the flow rate of the air supplied to the wire tensioner is adjusted based on the height position detected, and the tension applied to the wire is adjusted, the tension applied to the wire can be easily adjusted in a state in which the wire tensioner has been incorporated into the wire bonding apparatus.

In the wire tension adjustment method according to the present disclosure, in the height position detection step, the height position of the tip of the bonding arm may be detected using the flow rate of the air supplied to the wire tensioner as a reference air flow rate. In the adjustment step, based on a ratio between the height position detected of the tip of the bonding arm and a reference height position of the tip of the bonding arm, the flow rate of the air supplied to the wire tensioner may be corrected, and the tension applied to the wire may be adjusted.

Accordingly, wire tension can be easily adjusted.

In the wire tension adjustment method according to the present disclosure, after the adjustment step, air at a corrected flow rate may be supplied to the wire tensioner and the height position detection step may be executed. In response to a difference between the height position detected of the tip of the bonding arm and the reference height position exceeding a threshold range, the height position detection step and the adjustment step may be executed again.

Accordingly, the tension applied to wire can be relatively accurately adjusted.

In the wire tension adjustment method according to the present disclosure, in the height position detection step, the height position of the tip of the bonding arm may be detected a plurality of times at a plurality of flow rates of the air supplied to the wire tensioner. In the adjustment step, each ratio between each height position of the tip of the bonding arm detected at each flow rate and each reference height position of the tip of the bonding arm at each flow rate may be calculated. Each flow rate of the air supplied to the wire tensioner may be corrected based on each ratio calculated, and an approximation curve defining each reference height position of the tip of the bonding arm with respect to each flow rate corrected may be generated. The tension applied to the wire may be adjusted based on the approximation curve generated.

In this way, since the approximation curve defining the height position of the tip of the bonding arm with respect to the flow rate of the air supplied to the wire tensioner is generated, and the wire tension is adjusted based on the approximation curve generated, the wire tension required for bonding can be set according to a diameter, material or the like of the wire.

In the wire tension adjustment method according to the present disclosure, air at each flow rate corrected may be supplied to the wire tensioner and each height position of the tip of the bonding arm may be detected. In response to a difference between each height position detected at each flow rate and each reference height position at each flow rate exceeding each threshold range, the height position detection step and the adjustment step may be executed again.

Accordingly, the tension applied to wire can be relatively accurately adjusted.

A wire tension adjustment method according to the present disclosure is for adjusting tension applied to a wire of a wire bonding apparatus. The wire bonding apparatus includes: a bonding arm, rotatably attached to a bonding head and having a tip movable in an up-down direction; a wire clamper, attached to the bonding arm, gripping and releasing the wire inserted through a bonding tool held by the tip; a wire tensioner, applying tension to the wire by an airflow; an air flow detector, detecting a flow rate of air supplied to the wire tensioner; a height position detector, detecting a height position of the tip of the bonding arm; and a spring member, generating a rotational moment in a direction opposite to a rotation direction of the bonding arm. The wire tension adjustment method is characterized by including the following. In a detection step, in a state in which the wire is gripped by the wire clamper, while the flow rate of the air supplied to the wire tensioner is changed, a plurality of height positions of the tip of the bonding arm where a rotational moment in the rotation direction of the bonding arm due to tension of the wire and the rotational moment in the direction opposite to the rotation direction of the bonding arm due to the spring member balance each other and a plurality of flow rates of air are detected by the height position detector and the air flow detector. In an adjustment step, an approximation curve defining each height position of the tip of the bonding arm with respect to each flow rate detected is generated, and the tension applied to the wire is adjusted based on the approximation curve generated.

In this way, since the flow rate of the air supplied to the wire tensioner and the height position of the tip of the bonding arm are detected at the same time, and the approximation curve defining the height position of the tip of the bonding arm with respect to the flow rate of the air supplied to the wire tensioner is generated, the approximation curve can be easily generated. Since the wire tension is adjusted based on the approximation curve generated, the wire tension required for bonding can be set according to a diameter, material or the like of the wire.

In the wire tension adjustment method according to the present disclosure, the spring member may be a cross leaf spring in which two spring plates intersect in a cross shape, and the bonding arm may be attached to the bonding head so as to be rotatable about an axis along a line of intersection of the two spring plates.

Accordingly, the spring member that generates the rotational moment in the direction opposite to the rotation direction of the bonding arm can be configured in a simple configuration.

A wire tension adjuster according to the present disclosure is used in a wire bonding apparatus and adjusts tension applied to a wire. The wire bonding apparatus includes: a bonding arm, rotatably attached to a bonding head and having a tip movable in an up-down direction; a wire clamper, attached to the bonding arm, gripping and releasing the wire inserted through a bonding tool held by the tip; a wire tensioner, applying tension to the wire by an airflow; an air flow detector, detecting a flow rate of air supplied to the wire tensioner; a height position detector, detecting a height position of the tip of the bonding arm; and a spring member, generating a rotational moment in a direction opposite to a rotation direction of the bonding arm. The wire tension adjuster is characterized as follows. Air is supplied to the wire tensioner in a state in which the wire is gripped by the wire clamper, and the height position of the tip of the bonding arm where a rotational moment in the rotation direction of the bonding arm due to tension of the wire and the rotational moment in the direction opposite to the rotation direction of the bonding arm due to the spring member balance each other is detected by the height position detector. By adjusting the flow rate of the air supplied to the wire tensioner based on the height position detected, the tension applied to the wire is adjusted.

In the wire tension adjuster according to the present disclosure, the height position of the tip of the bonding arm may be detected by the height position detector using the flow rate of the air supplied to the wire tensioner as a reference air flow rate. Based on a ratio between the height position detected of the tip of the bonding arm and a reference height position of the tip of the bonding arm, the flow rate of the air supplied to the wire tensioner may be corrected, and the tension applied to the wire may be adjusted.

In the wire tension adjuster according to the present disclosure, the height position of the tip of the bonding arm may be detected a plurality of times by the height position detector at a plurality of flow rates of the air supplied to the wire tensioner that are detected by the air flow detector. Each ratio between each height position of the tip of the bonding arm detected at each flow rate and each reference height position of the tip of the bonding arm at each flow rate may be calculated. Each flow rate of the air supplied to the wire tensioner may be corrected based on each ratio calculated, and an approximation curve defining each reference height position of the tip of the bonding arm with respect to each flow rate corrected may be generated. The tension applied to the wire may be adjusted based on the approximation curve generated.

A wire tension adjuster according to the present disclosure is used in a wire bonding apparatus and adjusts tension applied to a wire. The wire bonding apparatus includes: a bonding arm, rotatably attached to a bonding head and having a tip movable in an up-down direction; a wire clamper, attached to the bonding arm, gripping and releasing the wire inserted through a bonding tool held by the tip; a wire tensioner, applying tension to the wire by an airflow; an air flow detector, detecting a flow rate of air supplied to the wire tensioner; a height position detector, detecting a height position of the tip of the bonding arm; and a spring member, generating a rotational moment in a direction opposite to a rotation direction of the bonding arm. The wire tension adjuster is characterized as follows. In a state in which the wire is gripped by the wire clamper, while the flow rate of the air supplied to the wire tensioner is changed, a plurality of height positions of the tip of the bonding arm where a rotational moment in the rotation direction of the bonding arm due to tension of the wire and the rotational moment in the direction opposite to the rotation direction of the bonding arm due to the spring member balance each other are detected by the height position detector, and a plurality of flow rates of the air supplied to the wire tensioner are detected by the air flow detector. An approximation curve defining each height position of the tip of the bonding arm with respect to each flow rate detected is generated, and the tension applied to the wire is adjusted based on the approximation curve generated.

In the wire tension adjuster according to the present disclosure, the spring member of the wire bonding apparatus may be a cross leaf spring in which two spring plates intersect in a cross shape, and the bonding arm may be attached to the bonding head so as to be rotatable about an axis along a line of intersection of the two spring plates.

Effects of the Invention

In the present disclosure, tension applied to a wire can be easily adjusted in a state in which a wire tensioner has been incorporated into a wire bonding apparatus.

DESCRIPTION OF THE EMBODIMENTS

Figure 1:
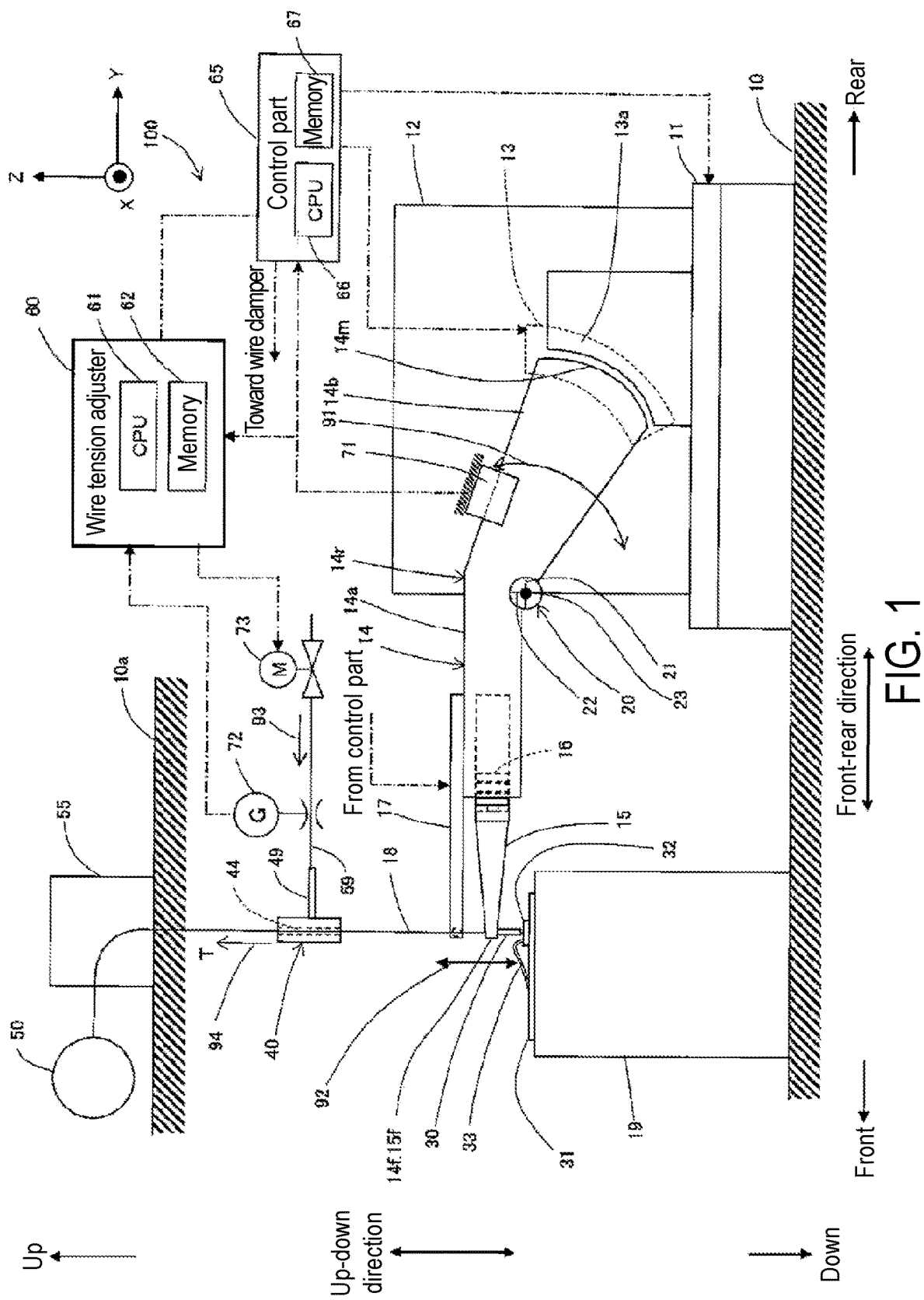
FIG. 1 is a system diagram showing a configuration of a wire tension adjuster and a configuration of a wire bonding apparatus according to an embodiment.

Hereinafter, a configuration of a wire tension adjuster 60 according to an embodiment and a wire bonding apparatus 100 to which the wire tension adjuster 60 is attached is described with reference to the drawings. First, the configuration of the wire bonding apparatus 100 is described with reference to FIG. 1. In the wire bonding apparatus 100, a wire 18 is bonded onto an electrode of a semiconductor chip 32 or an electrode of a substrate 31 by a capillary 30 being a bonding tool, and a wire loop 33 is formed.

As shown in FIG. 1, the wire bonding apparatus 100 includes a base 10, an XY table 11, a bonding head 12, a Z direction motor 13, a bonding arm 14, an ultrasonic vibrator 16, the capillary 30, a wire clamper 17, a bonding stage 19, a wire tensioner 40, a wire spool 50, an air guide 55, and a control part 65. In the following description, a direction in which the bonding arm 14 extends is a Y direction, a direction perpendicular to the Y direction on a horizontal plane is an X direction, and an up-down direction is a Z direction. In the description, the bonding arm 14 side is a front side or a negative side in the Y direction, the bonding head 12 side is a rear side or a positive side in the Y direction, a near side of a paper surface in FIG. 1 is a positive side in the X direction, the other side of the paper surface is a negative side in the X direction, an upward direction is a positive side in the Z direction, and a downward direction is a negative side in the Z direction.

The XY table 11 is attached to the base 10 and moves a device mounted on an upper side thereof in the XY directions.

The bonding head 12 is attached onto the XY table 11 and is moved in the XY directions by the XY table 11. The bonding head 12 has the bonding arm 14 rotatably attached thereto about a rotation axis 23 by a cross leaf spring 20 being a spring member, and has the Z direction motor 13 attached therein.

The Z direction motor 13 is composed of a stator 13a and a mover 14m, the stator 13a being fixed inside the bonding head 12, the mover 14m being attached to a mover attachment plate 14b extending rearward from a rear end 14r of the bonding arm 14 so as to face the stator 13a.

The bonding arm 14 is composed of a main body 14a, and an ultrasonic horn 15 attached in front of the main body 14a in the Y direction. The capillary 30 being the bonding tool is attached to a front end 15f of the ultrasonic horn 15, that is, a tip 14f of the bonding arm 14. The ultrasonic vibrator 16 is attached to a front end of the main body 14a. The ultrasonic horn 15 amplifies an ultrasonic vibration of the ultrasonic vibrator 16 attached to a front end of the bonding arm 14 and ultrasonically vibrates the capillary 30 attached to the front end 15f. The capillary 30 is provided with a through hole penetrating inside thereof in the up-down direction, and the wire 18 is inserted through the through hole.

The wire clamper 17 is attached to an upper surface on a front end side of the bonding arm 14. The wire clamper 17 extends to the front end 15f of the ultrasonic horn 15 to which the capillary 30 is attached, and has a tip part that opens and closes in the X direction to grip and release the wire 18.

The bonding stage 19 has an upper surface to which the substrate 31 mounted with the semiconductor chip 32 is fixed by suction, and heats the substrate 31 and the semiconductor chip 32 by a heater (not shown).

The wire spool 50 that supplies the wire 18 to the capillary 30 and the air guide 55 that changes a sending direction of the wire 18 fed out from the wire spool 50 into the Z direction are attached to an upper frame 10a fixed to the base 10.

Next, a detailed structure of the bonding arm 14 and the cross leaf spring 20 is described with reference to FIG. 2 and FIG. 3.

Figure 2:
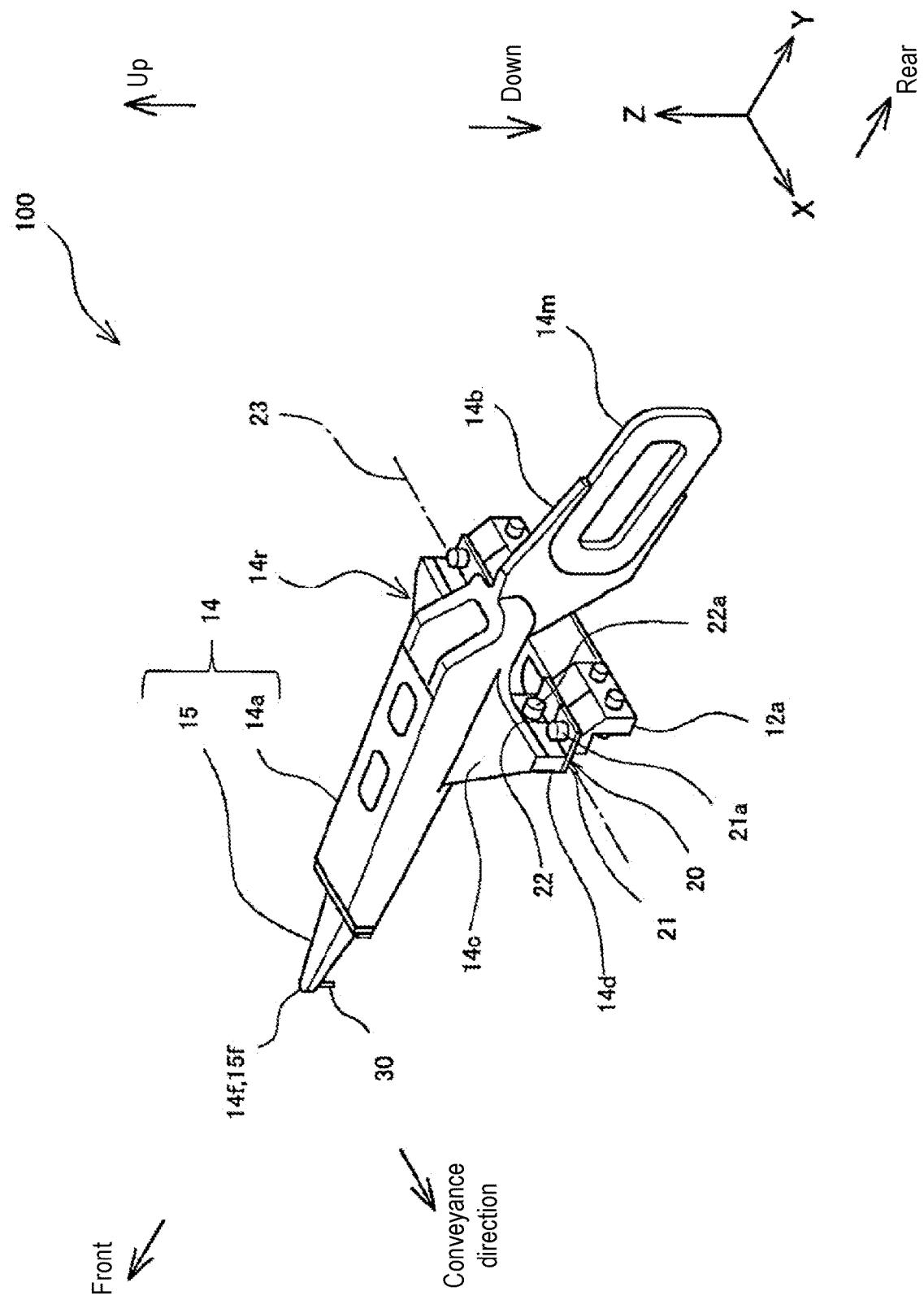
FIG. 2 is a perspective view showing a configuration of a bonding arm of the wire bonding apparatus shown in FIG. 1.

As shown in FIG. 2, an attachment rib 14c having a triangular shape extending respectively on the positive side and the negative side in the X direction is provided at the rear end 14r of the main body 14a. An attachment seat 14d to which the cross leaf spring 20 is attached is provided at a rear end of the attachment rib 14c. The rear end 14r of the bonding arm 14 is attached to a structural member 12a in front of the bonding head 12 in the Y direction by the cross leaf spring 20 attached to the attachment seat 14d. The mover attachment plate 14b of the Z direction motor 13 having a plate shape extends rearward in the Y direction from the rear end 14r of the main body 14a. The mover 14m is attached to the mover attachment plate 14b. The mover attachment plate 14b and the mover 14m are housed inside the bonding head 12.

Figure 3:
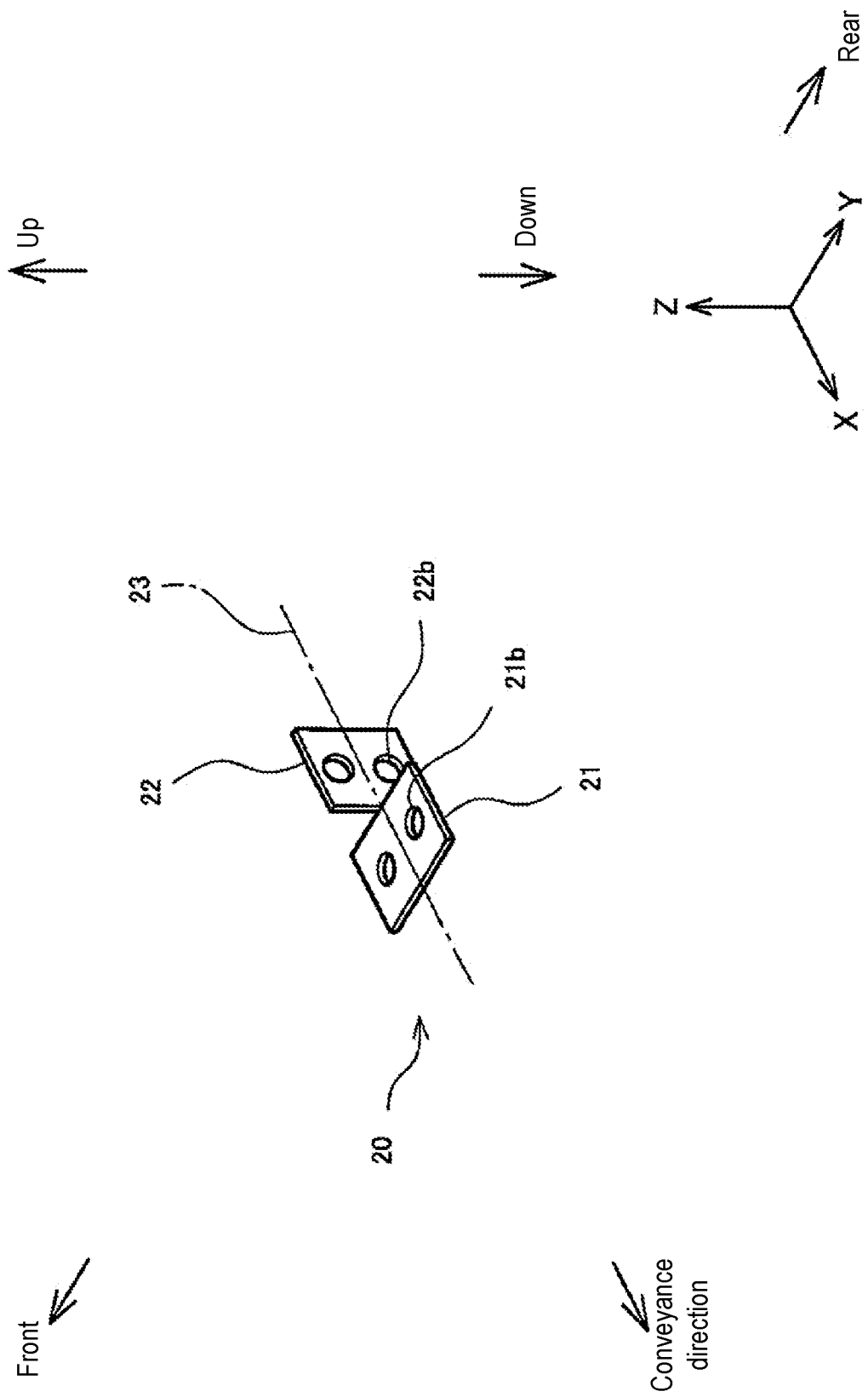
FIG. 3 is an enlarged perspective view showing a configuration of a cross leaf spring shown in FIG. 2.

As shown in FIG. 3, the cross leaf spring 20 is obtained by combining a horizontal spring plate 21 and a vertical spring plate 22 so that they intersect in a cross shape, the horizontal spring plate 21 and the vertical spring plate 22 being provided with bolt holes 21b and 22b. As shown in FIG. 2, a rear end (positive side in the Y direction) of the horizontal spring plate 21 is fixed to the structural member 12a of the bonding head 12 by a bolt 21a, and a tip (negative side in the Y direction) of the horizontal spring plate 21 is fixed to a lower surface of the attachment seat 14d of the bonding arm 14 by a bolt (not shown). An upper end of the vertical spring plate 22 is fixed to a vertical surface at a rear end of the attachment seat 14d of the bonding arm 14 by a bolt 22a, and a lower end of the vertical spring plate 22 is fixed to the structural member 12a of the bonding head 12 by a bolt (not shown). A line extending in the X direction in which the horizontal spring plate 21 and the vertical spring plate 22 intersect serves as the rotation axis 23 of the bonding arm 14. The cross leaf spring 20 rotatably supports the bonding arm 14 about the rotation axis 23.

In this way, the bonding arm 14 is rotatably attached about the rotation axis 23 with the rear end 14r extending in the X direction. The stator 13a is attached inside the bonding head 12 so as to face the mover 14m. When the stator 13a rotates the mover 14m about the rotation axis 23 of the cross leaf spring 20 as indicated by arrow 91 in FIG. 1, the capillary 30 attached to front end 15f of the ultrasonic horn 15 moves in the Z direction as indicated by arrow 92.

Figure 4:
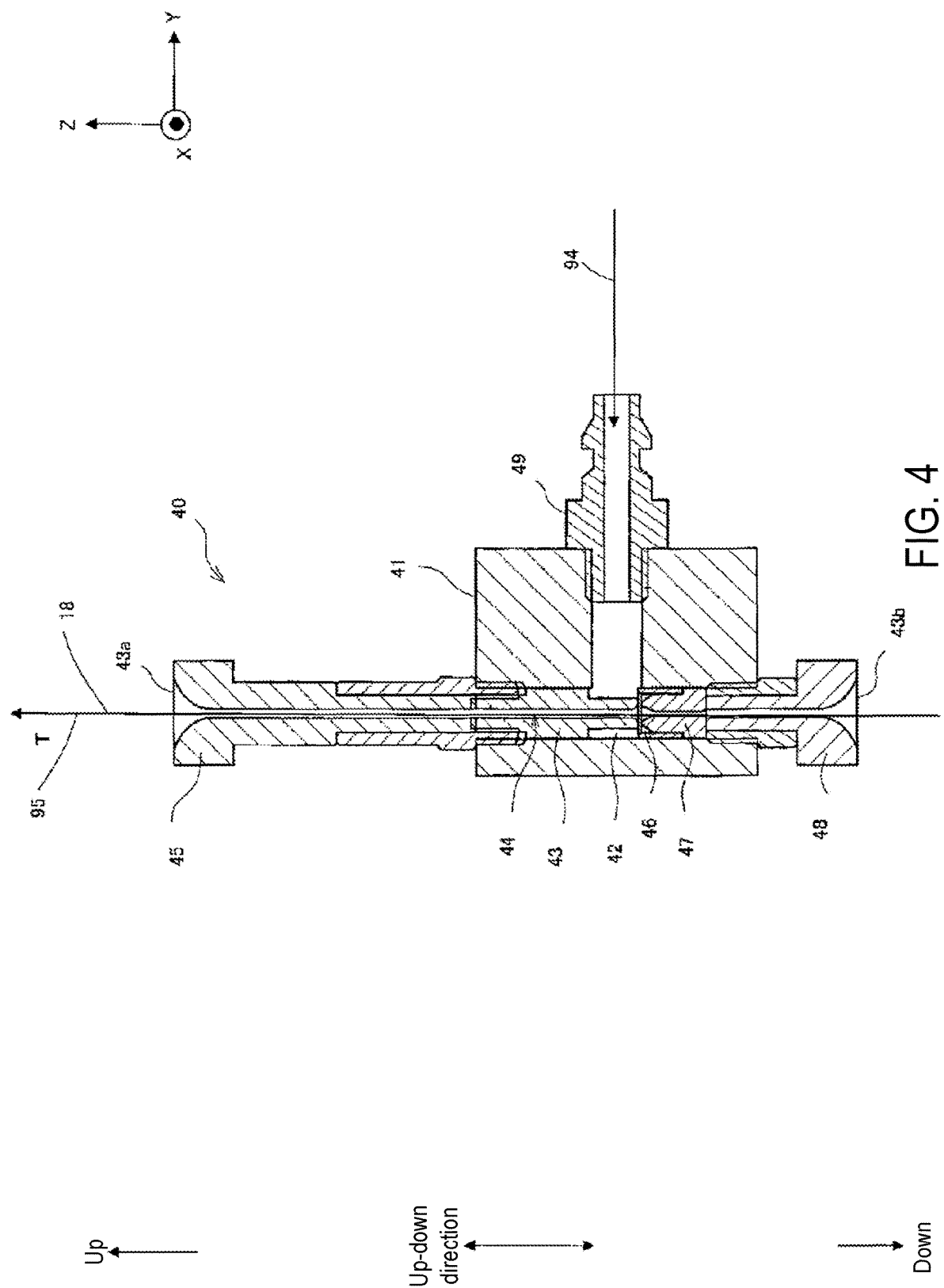
FIG. 4 is a sectional view of a wire tensioner shown in FIG. 1.

Next, a structure of the wire tensioner 40 that applies tension T to the wire 18 by an airflow is described in detail with reference to FIG. 4. As shown in FIG. 4, the wire tensioner 40 includes a main body part 41, an upper diffuser 45, a tubular part 43, a nozzle 47, a lower diffuser 48, and a connection port 49. A cavity 42 communicating with the connection port 49 is provided in the center of the main body part 41.

The upper diffuser 45, the tubular part 43, the nozzle 47, and the lower diffuser 48 each have in its center a through hole through which the wire 18 is inserted. The upper diffuser 45, the tubular part 43, the nozzle 47, and the lower diffuser 48 are sequentially connected to the main body part 41 from up to down so that the through holes in the respective centers communicate with each other. Each through hole communicates with each other in the up-down direction to form a wire passage 44.

The tubular part 43 is attached inside the main body part 41 so that a lower part thereof communicates with the cavity 42 of the main body part 41 and an upper part thereof extends to an upper surface of the main body part 41. The nozzle 47 is attached inside the main body part 41 so as to extend downward from a lower end of the cavity 42. A gap 46 communicating with the cavity 42 is provided at a lower end of the tubular part 43 and an upper end of the nozzle 47.

A portion of air that has flowed into the cavity 42 from the connection port 49 as indicated by arrow 94 in FIG. 4 flows from the gap 46 into the through hole of the tubular part 43, flows upward through the through hole of the upper diffuser 45, and is released to the atmosphere from an upper end 43a of the upper diffuser 45. A portion of the air flows from the gap 46 into the through hole of the nozzle 47, flows downward, and is released to the atmosphere from a lower end 43b of the lower diffuser 48. Since the through hole of the nozzle 47 has a smaller diameter than that of the through hole of the tubular part 43, a major portion of the air that has flowed in from the connection port 49 flows upward through the wire passage 44. Due to fluid resistance of this upwardly flowing air, upward tension T is applied to the wire 18 as indicated by arrow 95 in FIG. 4. Thus, the tension T applied to the wire 18 increases as a flow rate G of the air flowing into the wire tensioner 40 increases.

Returning to FIG. 1, a height position detector 71 that detects a height position H of the tip 14f of the bonding arm 14 is attached inside the bonding head 12 along a side surface of the mover attachment plate 14b extending rearward in the Y direction from the rear end 14r of the main body 14a of the bonding arm 14.

An air flow detector 72 that detects the flow rate G of the air supplied to the wire tensioner 40 and an air flow regulating valve 73 that adjusts the flow rate G of the air are attached to an air pipe 59 that is connected to the connection port 49 of the wire tensioner 40 and supplies air in a direction of arrow 93.

The wire bonding apparatus 100 includes the control part 65 that controls driving of the tip 14f of the bonding arm 14 in the up-down direction, driving in the XY directions, and opening and closing of the wire clamper 17. The control part 65 is composed of a computer including therein a CPU 66 that processes information and a memory 67 that stores control programs or control data. The height position H detected by the height position detector 71 is input to the control part 65. Based on the height position H input from the height position detector 71, the control part 65 drives the Z direction motor 13 to drive the tip 14f of the bonding arm 14 in the up-down direction. The wire clamper 17 is opened and closed according to a bonding schedule.

Based on the height position H from the height position detector 71 and the flow rate G of the air detected by the air flow detector 72, the wire tension adjuster 60 drives the air flow regulating valve 73 to adjust the flow rate G of the air supplied to the wire tensioner 40, thereby adjusting the tension T applied to the wire 18. As shown in FIG. 1, the wire tension adjuster 60 is composed of a computer including therein a CPU 61 that processes information and a memory 62 that stores operation programs, data or the like. The wire tension adjuster 60 is connected to the control part 65 and exchanges data therewith.

Next, a principle of adjusting the flow rate G of the air supplied to the wire tensioner 40 based on the height position H detected by the height position detector 71 and adjusting the tension T applied to the wire 18 is described with reference to FIG. 5 to FIG. 8.

Figure 5:
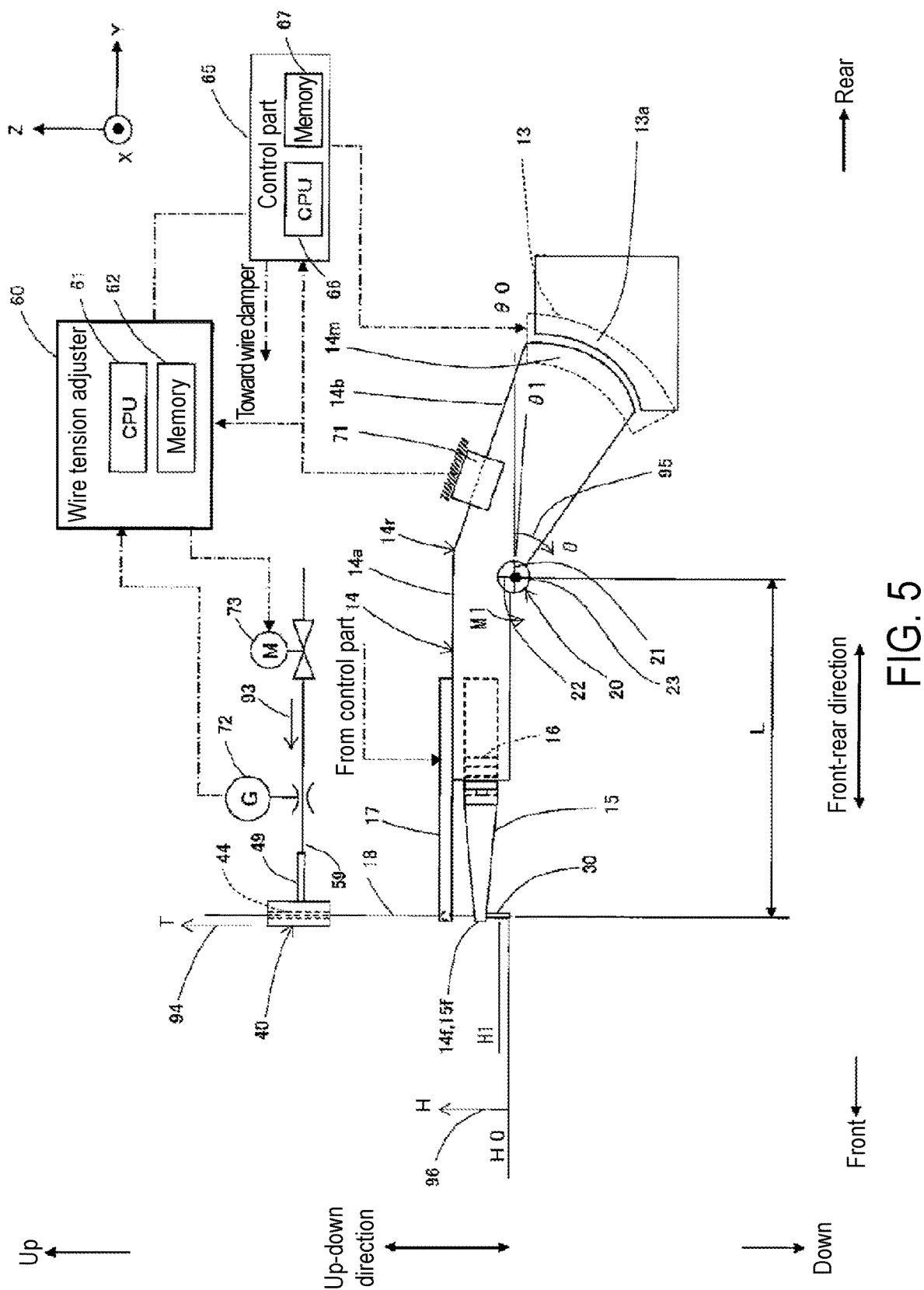
FIG. 5 is a system diagram showing each item detected by a wire tension detection device according to an embodiment.

In the following description, as shown in FIG. 5, a state in which the bonding arm 14 is stationary without receiving rotational moment M1 from the cross leaf spring 20 is described as a neutral state. In the neutral state, the bonding arm 14 may be in a substantially horizontal position as shown in FIG. 5, or may be in a position after slight movement in the up-down direction. As will be described later, in a neutral position adjustment step shown in FIG. 9 and FIG. 15, a neutral position H0 detected by the height position detector 71 is adjusted to 0 in the case where the bonding arm 14 is in the neutral state. At this time, a neutral position θ0 in a rotation direction of the bonding arm 14 is also adjusted to 0.

The cross leaf spring 20 generates the rotational moment M1 in a direction opposite to the rotation direction of the bonding arm 14. In the wire bonding apparatus 100, as indicated by solid line a of FIG. 6, the cross leaf spring 20 generates the rotational moment M1 in the direction opposite to the rotation direction in proportion to a rotation angle θ of the bonding arm 14 from the neutral position θ0 in the rotation direction. As shown in FIG. 5, the counterclockwise rotational moment M1 may be expressed by Equation 1 below by defining a clockwise rotation angle from the neutral position θ0 in the rotation direction as θ1 and a spring constant of rotation of the cross leaf spring 20 as Km.

$$M1 = \theta1 \times Km \qquad \text{(Equation 1)}$$

Figure 6:
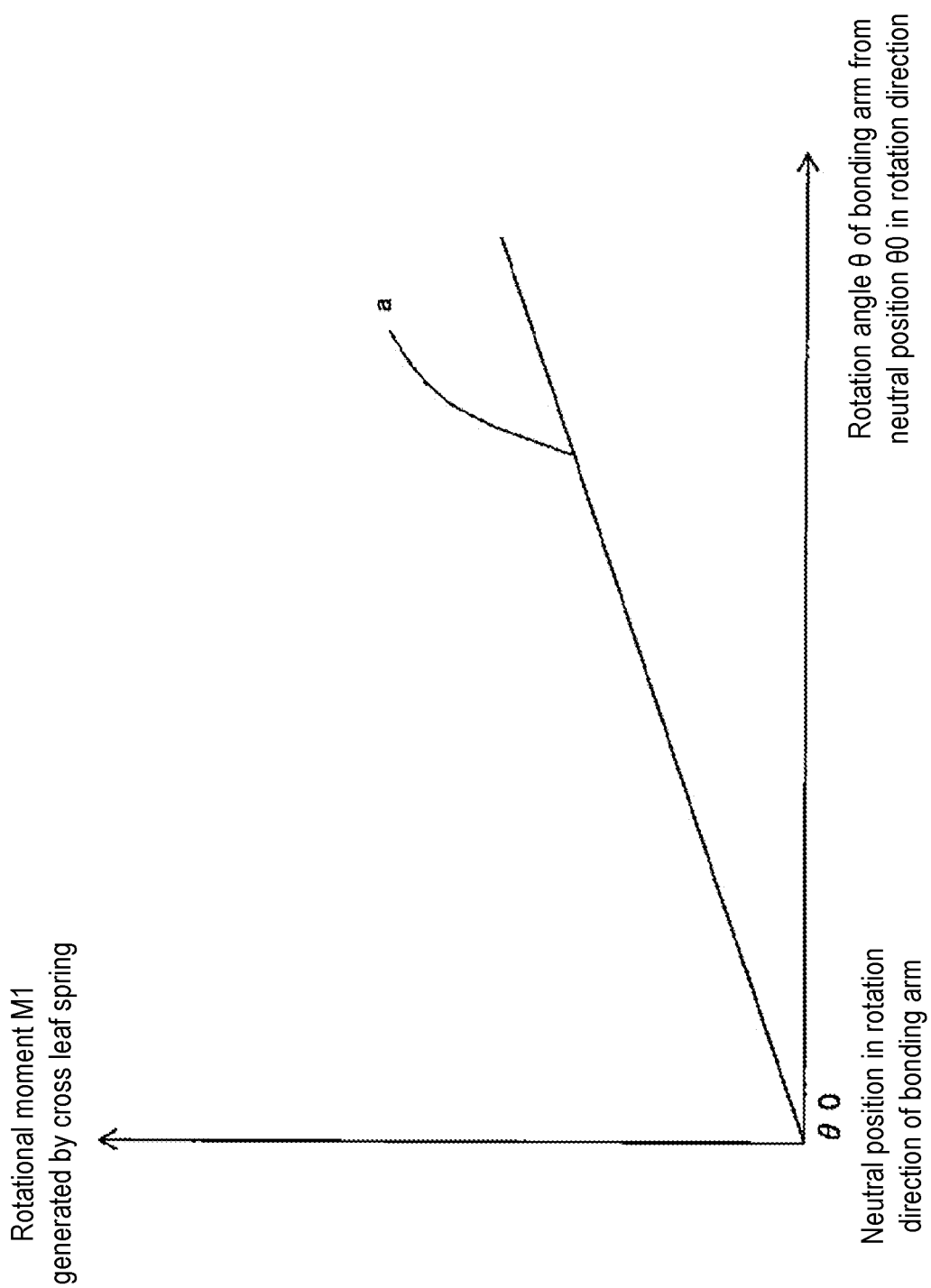
FIG. 6 is a graph showing a change in rotational moment M1 generated by a cross leaf spring with respect to a rotation angle θ of a bonding arm from a neutral position θ0 in a rotation direction.

As shown in FIG. 5 and FIG. 6, when air flows through the wire tensioner 40, the tension T is applied to the wire 18 in the upward direction. At this time, when the wire clamper 17 is closed and the wire 18 is gripped by the wire clamper 17, by the tension T in the upward direction applied to the wire 18, the tip of the wire clamper 17 and the tip 14f of the bonding arm 14 are pulled upward. Rotational moment M2 expressed by Equation 2 below by defining a distance in the Y direction between the rotation axis 23 and the wire 18 as L is applied to the cross leaf spring 20. The rotational moment M2 is a clockwise rotational moment in the rotation direction of the bonding arm 14.

$$M2 = T \times L \qquad \text{(Equation 2)}$$

When the tip 14f of the bonding arm 14 is displaced from the neutral position H0 in a height direction 96 by the height position H in the Z direction, the bonding arm 14 is displaced clockwise by the rotation angle θ1 about the rotation axis 23 by an angle shown in Equation 3 below.

$$\theta1 = H/L \qquad \text{(Equation 3)}$$

If air flows through the wire tensioner 40, the tension T is applied to the wire 18 in the upward direction, and the tip 14f of the bonding arm 14 stops at the height position H, since the rotational moment M2 in the rotation direction of the bonding arm 14 due to the tension T of the wire 18 and the rotational moment M1 in the direction opposite to the rotation direction of the bonding arm 14 due to the cross leaf spring 20 balance each other, M1=M2 is satisfied.

From Equations 1 and 3, the following is reached.

$$M1 = \theta1 \times Km = (H/L) \times Km \qquad \text{(Equation 4)}$$

From Equations 2 and 4, the following is reached.

$$T = M2/L = M1/L = (H/L) \times Km/L = H \times Km/L^2 = C \times H \qquad \text{(Equation 5)}$$

Here, C is a constant.
Thus, as shown below:

$$T \propto H \qquad \text{(Equation 6)}$$

The tension T is proportional to the height position H.

Figure 7:
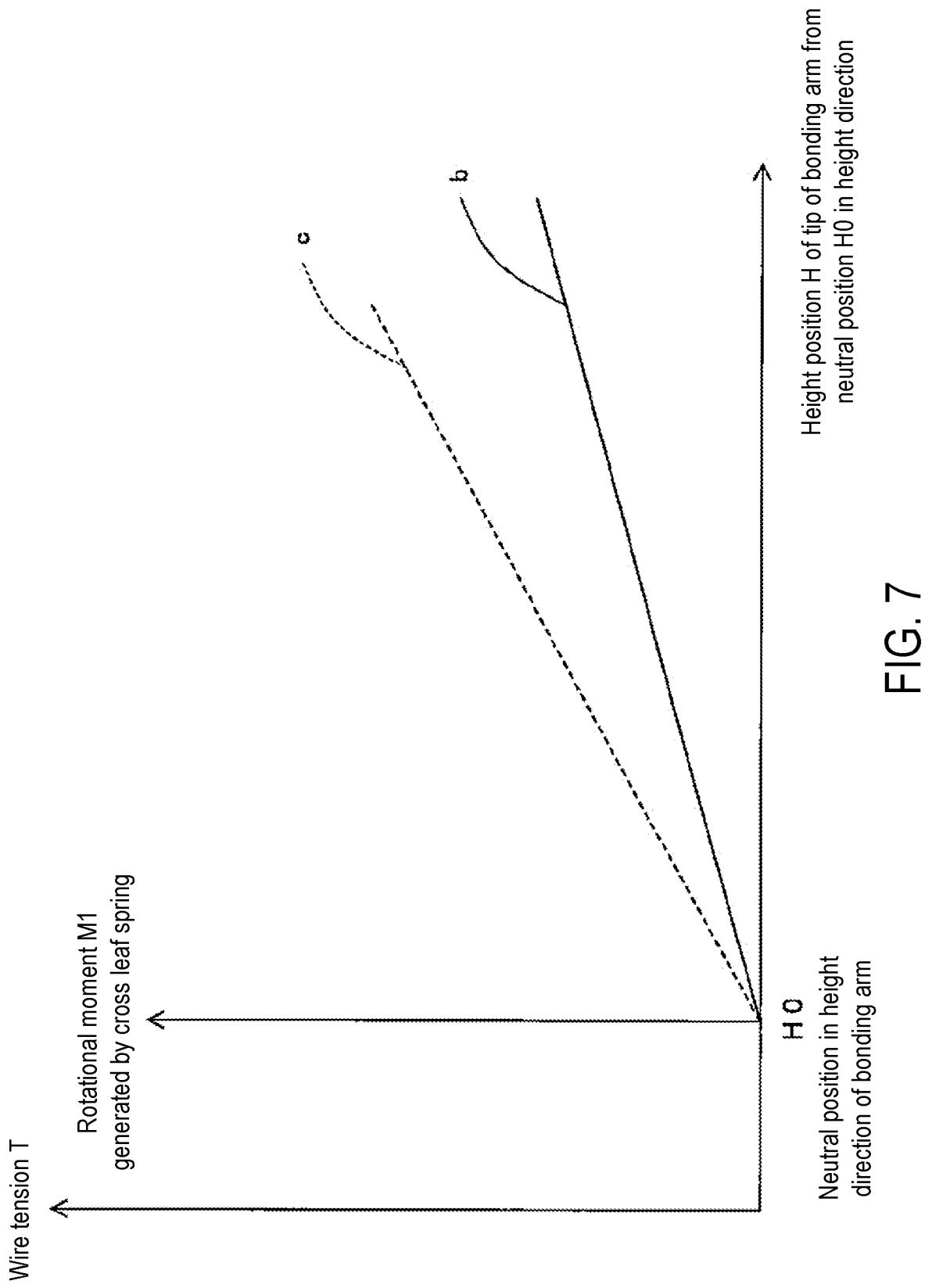
FIG. 7 is a graph showing a change in the rotational moment M1 generated by a cross leaf spring and tension T applied to a wire with respect to a height position H of a tip of a bonding arm from a neutral position H0 in a height direction.

Thus, as indicated by solid line b and broken line c of FIG. 7, the tension T applied to the wire 18 and the rotational moment M1 generated by the cross leaf spring 20 are each proportional to the height position H of the tip 14f of the bonding arm 14 from the neutral position H0 in the height direction.

Figure 8:
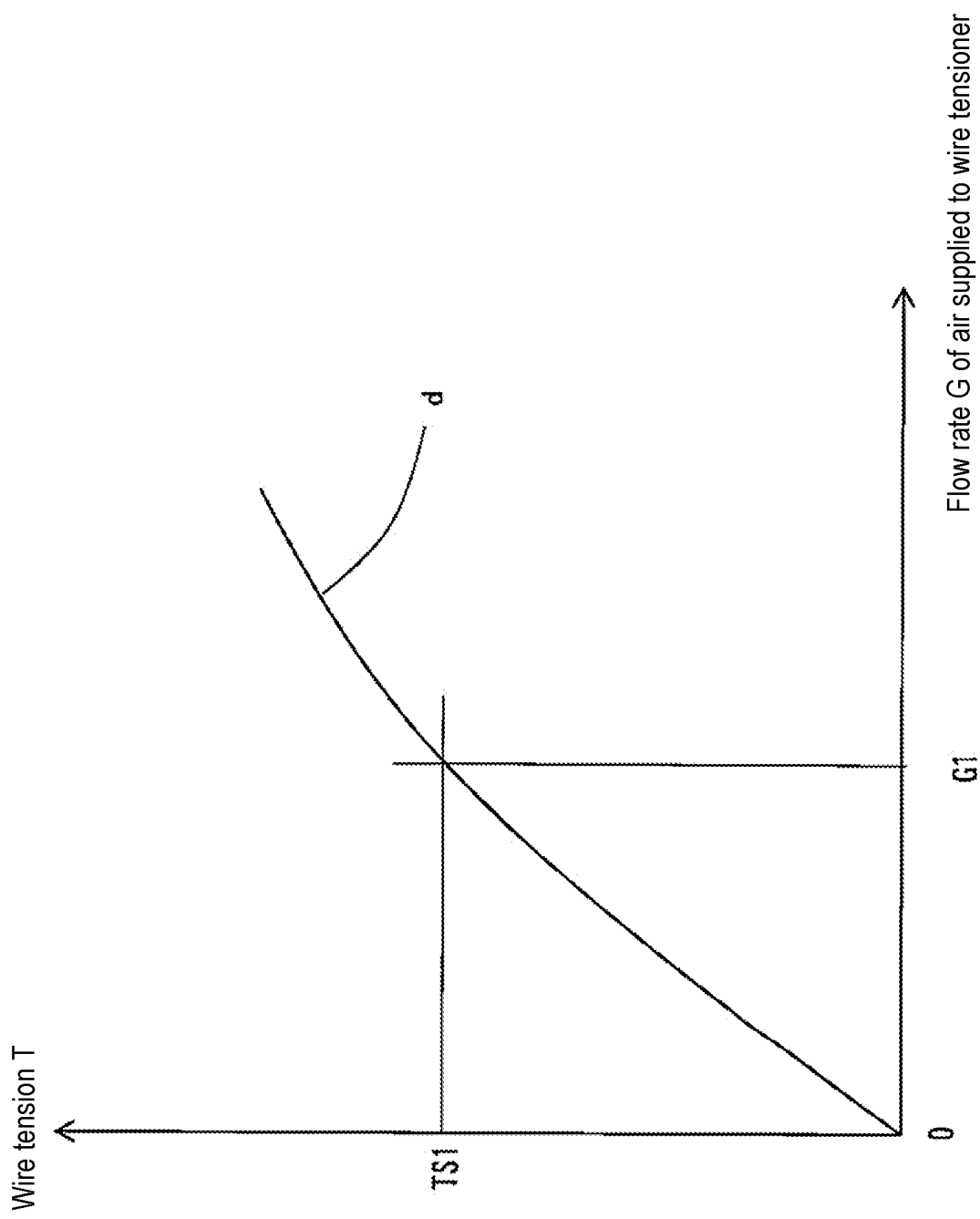
FIG. 8 is a graph showing a change in the height position H of a tip of a bonding arm from the neutral position H0 in a height direction and the tension T applied to a wire with respect to a flow rate G of air supplied to a wire tensioner.

There is a correlation as indicated by solid line d of FIG. 8 between the flow rate G of the air supplied to the wire tensioner 40 and the tension T applied to the wire 18. This correlation is, for example, obtained by measurement in advance using an electronic balance at the time of shipment of the wire tensioner 40 from the factory. As in Equation 5, since the tension T is proportional to the height position H of the tip 14f of the bonding arm 14 from the neutral position H0 in the height direction, by converting the tension T into the height position H by Equation 5, solid line d of FIG. 8 can be converted into a correlation function of the height position H of the tip 14f of the bonding arm 14 from the neutral position H0 in the height direction with respect to the flow rate G of the air supplied to the wire tensioner 40.

Thus, air at a certain flow rate G is supplied to the wire tensioner 40, the height position H of the tip 14f of the bonding arm 14 from the neutral position H0 in the height direction is detected by the height position detector 71, and the tension T with respect to the flow rate G can be calculated by converting the height position H into the tension T by Equation 5.

In the wire tension adjuster 60, by applying this principle, storing in the memory 62 a characteristic curve e (see FIG. 11) obtained by converting the pre-measured correlation between the flow rate G of the air supplied to the wire tensioner 40 and the tension T applied to the wire 18 into the correlation function of the height position H of the tip 14f of the bonding arm 14 from the neutral position H0 in the height direction with respect to the flow rate G of the air as shown in FIG. 8, and driving the air flow regulating valve 73 to adjust the flow rate G of the air supplied to the wire tensioner 40 based on the height position H detected by the height position detector 71 and the flow rate G of the air detected by the air flow detector 72, the tension T applied to the wire 18 is adjusted.

A first operation of the wire tension adjuster 60 is hereinafter described with reference to FIG. 9 to FIG. 11. The wire tension adjuster 60 stores in the memory 62 the characteristic curve e (indicated by a solid line in FIG. 11) indicating the correlation of the height position H of the tip 14f of the bonding arm 14 from the neutral position H0 in the height direction with respect to the flow rate G of the air supplied to the wire tensioner 40. The characteristic curve e is a curve obtained by converting a characteristic curve (solid line d shown in FIG. 8) of the tension T of the wire 18 with respect to the flow rate G of the air measured in advance at the time of shipment from the factory or the like into the correlation of the height position H with respect to the flow rate G of the air. In the following description, the wire tensioner 40 is described as having a characteristic that the height position H is smaller than the characteristic curve e with respect to the flow rate G of the air, as indicated by dot-and-dash line f of FIG. 11.

Figure 9:
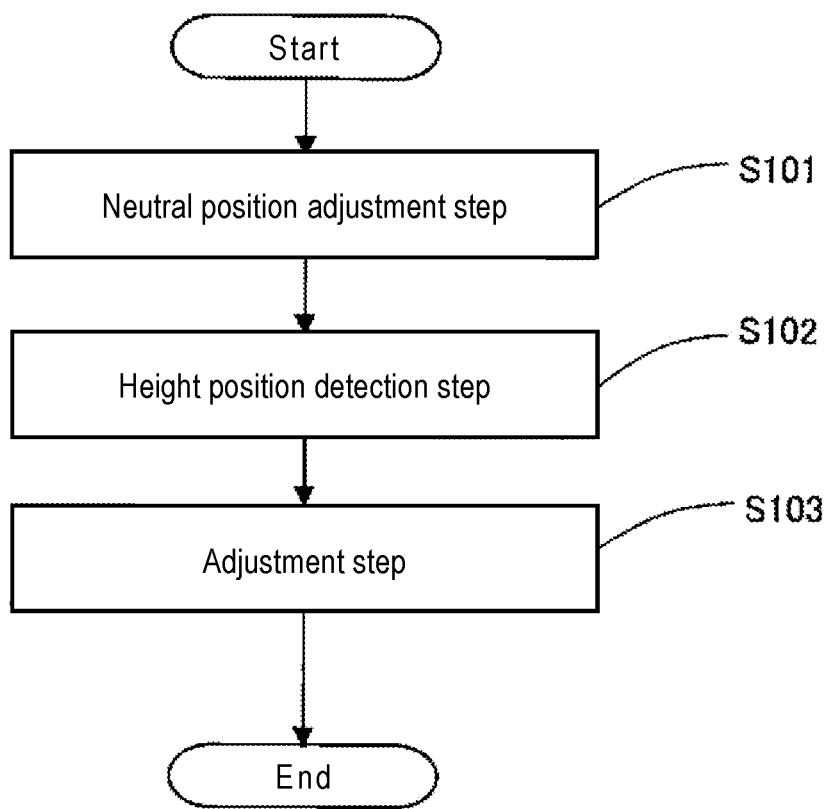
FIG. 9 is a flowchart showing an operation of a wire tension adjuster according to an embodiment.

As shown in step S101 of FIG. 9, the CPU 61 of the wire tension adjuster 60 executes the neutral position adjustment step. The neutral position adjustment step is a step of bringing the bonding arm 14 into the neutral state of being stationary without receiving the rotational moment M1 from the cross leaf spring 20. In the neutral position adjustment step, for example, the Z direction motor 13 may be stopped and a weight may be placed on the bonding arm 14 until the bonding arm 14 stops in a substantially horizontal position. If the height position H detected by the height position detector 71 stops changing from a constant value, the CPU 61 of the wire tension adjuster 60 determines that the bonding arm 14 has been adjusted to the neutral state, and takes the height position H output by the height position detector 71 at that time as the neutral position H0. The neutral position H0 is set to 0 as a reference position for detection of the height position H. Accordingly, the height position H detected by the height position detector 71 is the amount of displacement in the Z direction of the tip 14f of the bonding arm 14 from the neutral position H0 in the height direction. If the bonding arm 14 is stationary in the substantially horizontal position with the capillary 30 attached to the ultrasonic horn 15, the CPU 61 of the wire tension adjuster 60 takes the height position H input from the height position detector 71 in that state as the neutral position H0, and sets the neutral position H0 to 0 as the reference position for detection of the height position H.

Next, the CPU 61 proceeds to step S102 of FIG. 9 to execute a height position detection step on the tip 14f of the bonding arm 14, and then proceeds to step S103 of FIG. 9 to execute an adjustment step. In the height position detection step, air is supplied to the wire tensioner 40 in a state in which the wire 18 is gripped by the wire clamper 17, and the height position H of the tip 14f of the bonding arm 14 is detected. In the adjustment step, by adjusting the flow rate G of the air supplied to the wire tensioner 40 based on the height position H detected, the tension T applied to the wire 18 is adjusted. Hereinafter, the height position detection step and the adjustment step in the first operation are described in detail with reference to FIG. 10 and FIG. 11. Steps S201 to S203 described in FIG. 10 indicate the height position detection step, and steps S204 to S206 indicate the adjustment step.

Figure 10:
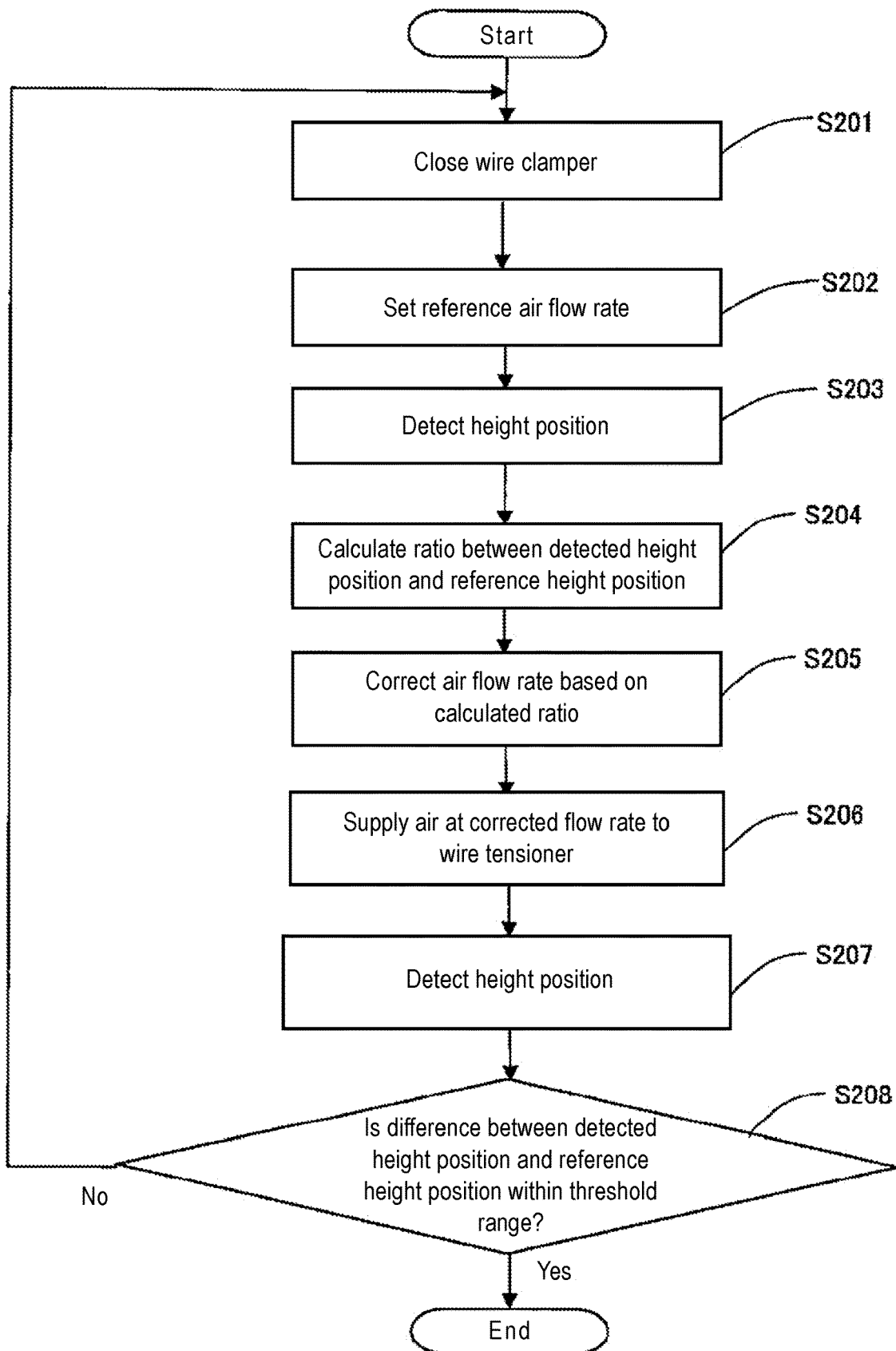
FIG. 10 is a flowchart showing details of a first operation of a wire tension adjuster according to an embodiment.

As shown in step S201 of FIG. 10, the CPU 61 of the wire tension adjuster 60 outputs a signal for closing the wire clamper 17 to the control part 65 of the wire bonding apparatus 100. When the control part 65 of the wire bonding apparatus 100 receives the signal for closing the wire clamper 17 from the wire tension adjuster 60, the control part 65 closes the wire clamper 17 and holds a state in which the wire 18 is gripped by the wire clamper 17.

Figure 11:
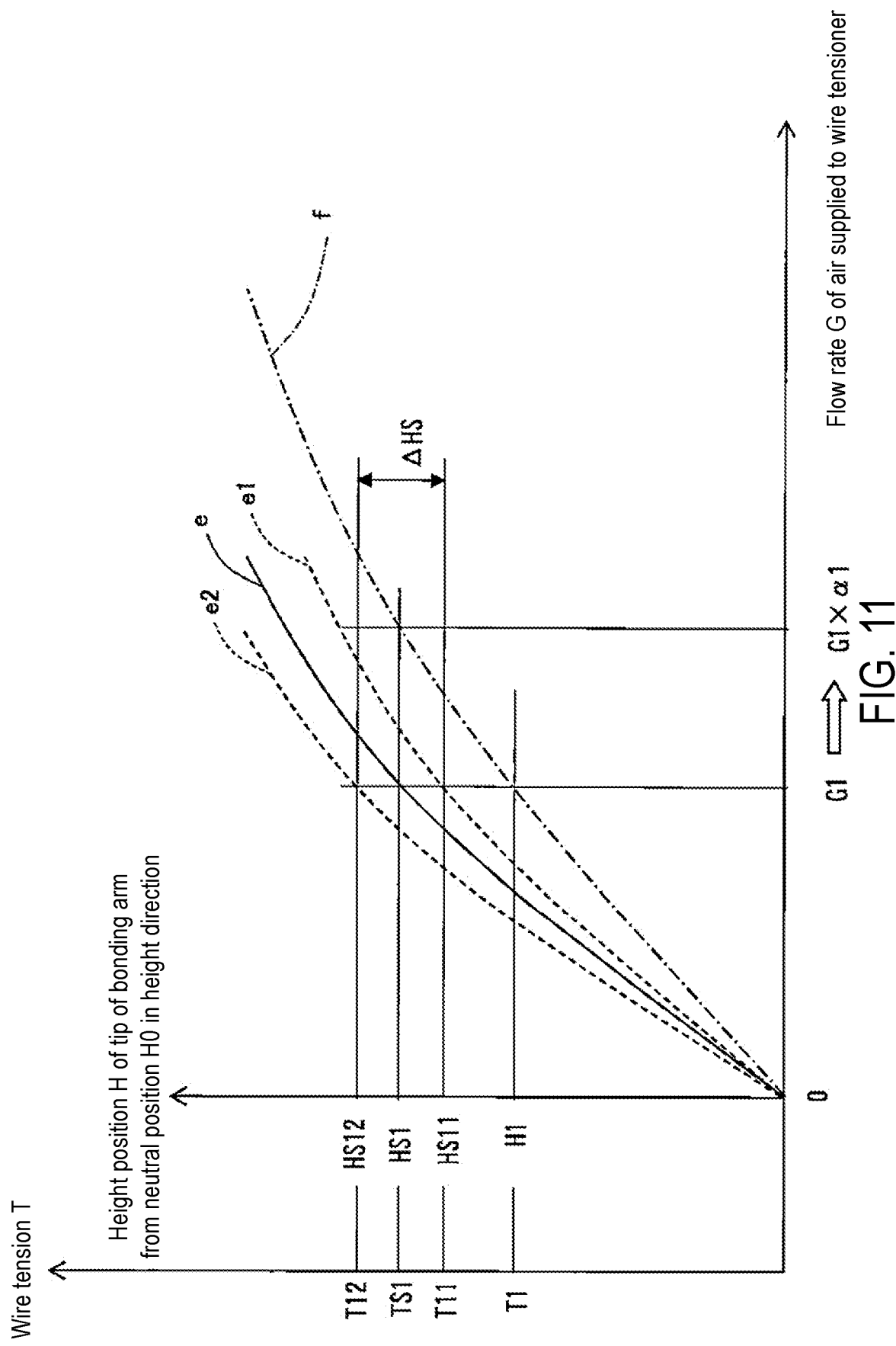
FIG. 11 is a graph showing a change in the height position H of a tip of a bonding arm from the neutral position H0 in a height direction and a change in the tension T applied to a wire with respect to the flow rate G of air supplied to a wire tensioner.

The CPU 61 proceeds to step S202 of FIG. 10 in which, while the flow rate G of the air supplied to the wire tensioner 40 is detected by the air flow detector 72, the air flow regulating valve 73 is driven to set the flow rate G to a reference air flow rate G1 shown in FIG. 11. Here, the reference air flow rate G1 can be freely set.

The CPU 61 proceeds to step S203 of FIG. 10, in which the height position H of the tip 14f of the bonding arm 14 is detected from the height position detector 71. As described above, if air flows through the wire tensioner 40, the tension T is applied to the wire 18 in the upward direction, and the tip 14f of the bonding arm 14 stops at the height position H, the rotational moment M2 in the rotation direction of the bonding arm 14 due to the tension T of the wire 18 and the rotational moment M1 in the direction opposite to the rotation direction of the bonding arm 14 due to the cross leaf spring 20 balance each other. Thus, the height position detector 71 detects a plurality of height positions of the tip 14f of the bonding arm 14 where the rotational moment M2 in the rotation direction of the bonding arm 14 due to the tension T of the wire 18 and the rotational moment M1 in the direction opposite to the rotation direction of the bonding arm 14 due to the cross leaf spring 20 balance each other. As described above, since the wire tensioner 40 has the characteristic that the height position H is smaller than the characteristic curve e with respect to the flow rate G of the air, as indicated by dot-and-dash line f of FIG. 11, a height position H1 detected by the height position detector 71 when air at the reference air flow rate G1 is supplied to the wire tensioner 40 has a smaller value than a reference height position HS1. Here, the height position H1 is displacement in the Z direction of the tip 14f of the bonding arm 14 from the neutral position H0 in the height direction.

Next, the CPU 61 proceeds to step S204 of FIG. 10. In step S204, with reference to the characteristic curve e stored in the memory 62 and indicated by a solid line in FIG. 11, the CPU 61 calculates the reference height position HS1 when the air at the reference air flow rate G1 is supplied to the wire tensioner 40. Here, the reference height position HS1 corresponds to tension TS1 applied to the wire 18. The CPU 61 calculates a ratio α1 between the height position H1 detected by the height position detector 71 and the reference height position HS1 as in Equation 7 below.

$$\alpha 1 = HS1/H1 \qquad \text{(Equation 7)}$$

Next, in step S205 of FIG. 10, the CPU 61 corrects the flow rate G of the air supplied to the wire tensioner 40 using the ratio α1 calculated. For example, as shown in FIG. 11, if the tension TS1 is applied to the wire 18 by the wire tensioner 40, a flow rate of the air supplied to the wire tensioner 40 is corrected to a flow rate (G1×α1). In step S206 of FIG. 10, the flow rate G of the air supplied to the wire tensioner 40 is taken as the corrected flow rate (G1×α1). Accordingly, the tension TS1 is applied to the wire 18, and the height position H detected by the height position detector 71 at that time becomes the reference height position HS1. Accordingly, the tension applied to wire 18 can be adjusted to the tension TS1.

After executing step S206 of FIG. 10, the CPU 61 ends the adjustment step. In the first operation shown in FIG. 10, after the adjustment step, the height position H after correction of the flow rate G of the air is detected in step S207 of FIG. 10, and it is determined in step S208 of FIG. 10 whether a difference between the height position H detected and the reference height position HS1 is within a threshold range. Here, the threshold range is, for example, a range indicated by broken lines e1 and e2 in FIG. 11. At the flow rate (G1×α1) of air after correction, the CPU 61 determines whether the height position H detected is within a range ΔHS between an upper threshold value HS11 corresponding to tension T11 and a lower threshold value HS12 corresponding to tension T12. If the CPU 61 makes a determination of YES in step S208 of FIG. 10, the first operation is ended. If required tension T is specified, from the characteristic curve indicating the pre-measured correlation between the flow rate G of the air supplied to the wire tensioner 40 and the tension T applied to the wire 18 as indicated by solid line d of FIG. 8, the flow rate G of the air that applies the specified tension T to the wire 18 is calculated. The flow rate G of the air calculated is multiplied by the ratio α1 to correct the flow rate G to the flow rate (G×α1), and the air is supplied to the wire tensioner 40.

On the other hand, if the CPU 61 makes a determination of NO in step S208 of FIG. 10, the CPU 61 returns to step S201 of FIG. 10 to repeatedly execute the height position detection step and the adjustment step. Accordingly, the tension T applied to the wire 18 can be relatively accurately adjusted.

As described above, based on the height position H detected by the height position detector 71 and the flow rate G of the air detected by the air flow detector 72, the wire tension adjuster 60 adjusts the flow rate G of the air supplied to the wire tensioner 40, thereby being able to adjust the tension T applied to the wire 18. Hence, the tension T applied to the wire 18 can be easily adjusted in a state in which the wire tensioner 40 has been incorporated into the wire bonding apparatus 100.

Next, a second operation of the wire tension adjuster 60 is hereinafter described with reference to FIG. 12 and FIG. 13. Operations similar to the first operation described above with reference to FIG. 9 to FIG. 11 will be briefly described. The wire tension adjuster 60 stores in the memory 62 a characteristic curve p (indicated by a solid line in FIG. 13) indicating the correlation of the height position H of the tip 14f of the bonding arm 14 from the neutral position H0 in the height direction with respect to the flow rate G of the air supplied to the wire tensioner 40. The characteristic curve p is a curve obtained by converting the characteristic curve (solid line d shown in FIG. 8) of the tension T of the wire 18 with respect to the flow rate G of the air measured in advance at the time of shipment from the factory or the like into the correlation of the height position H with respect to the flow rate G of the air. In the second operation, steps S301 to S306 shown in FIG. 12 indicate the height position detection step, and steps S307 to S314 indicate the adjustment step. In the second operation, in the height position detection step, a height position Hn of the tip 14f of the bonding arm 14 is detected a plurality of times at a plurality of flow rates Gn of the air supplied to the wire tensioner 40. In the adjustment step, each ratio αn between each height position Hn of the tip 14f of the bonding arm 14 detected at each flow rate Gn and each reference height position HSn of the tip 14f of the bonding arm 14 at each flow rate Gn is calculated. Based on each ratio αn calculated, each flow rate Gn of the air supplied to the wire tensioner 40 is corrected. An approximation curve q is generated defining each reference height position HSn of the tip 14f of the bonding arm 14 with respect to each corrected flow rate (Gn×αn). Based on the approximation curve q generated, the tension T applied to the wire 18 is adjusted. Each step is hereinafter described in detail. In the following description, a case of detecting a plurality of height positions H1 to H5 at five flow rates G1 to G5 is described. Here, as shown in FIG. 13, the plurality of height positions H1 to H5 correspond to tension T1 to tension T5 applied to the wire 18, and a plurality of reference height positions HS1 to HS5 correspond to tension TS1 to tension TS5 applied to the wire 18.

The CPU 61 starts the height position detection step. As shown in step S301 of FIG. 12, the CPU 61 sets a counter N to an initial value 1. The process proceeds to step S302 of FIG. 12, in which the wire clamper 17 is closed and a state is reached in which the wire 18 is gripped by the wire clamper 17, like step S201 of FIG. 10 described above.

Figure 12:
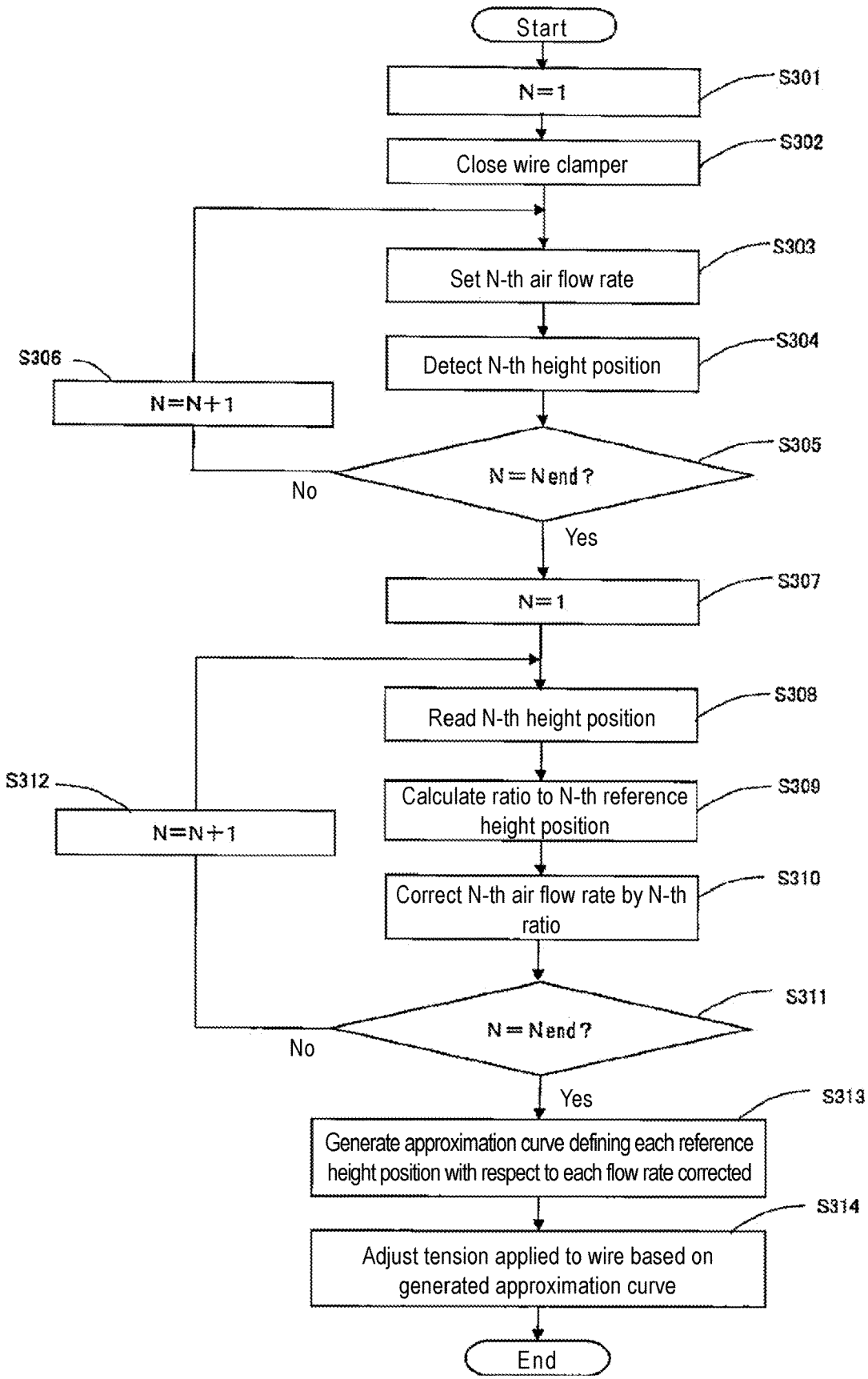
FIG. 12 is a flowchart showing a second operation of a wire tension adjuster according to an embodiment.
Figure 13:
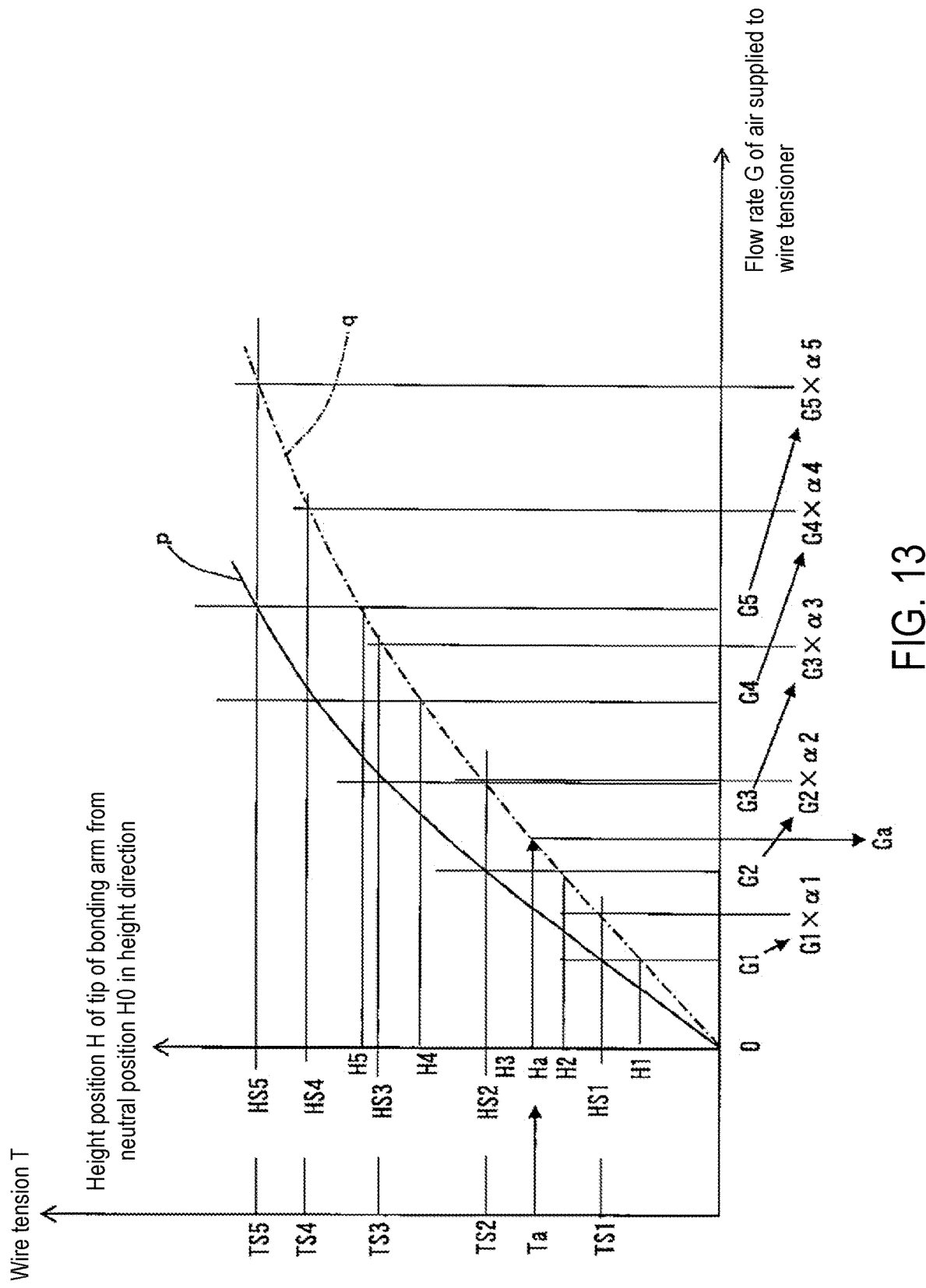
FIG. 13 is a graph showing a change in the height position H of a tip of a bonding arm from the neutral position H0 in a height direction and a change in the tension T applied to a wire with respect to the flow rate G of air supplied to a wire tensioner.

Next, the CPU 61 sets the flow rate G of the air supplied to the wire tensioner 40 to the first flow rate G1 among the plurality of flow rates G1 to G5 shown in FIG. 13. The CPU 61 proceeds to step S304 of FIG. 12, in which the height position H1 at that time is detected by the height position detector 71 and is stored in the memory 62 together with the flow rate G1. The CPU 61 proceeds to step S305 of FIG. 12, in which it is determined whether the counter N has reached a final value Nend. In this example, Nend=5. If the CPU 61 makes a determination of NO in step S305, the CPU 61 increments the counter N by 1 in step S306 of FIG. 12, and returns to step S303 of FIG. 12, in which the CPU 61 sets the flow rate G of the air supplied to the wire tensioner 40 to the second flow rate G2. In step S304 of FIG. 12, the height position H2 is detected by the height position detector 71. Hereinafter, similarly, the CPU 61 repeatedly executes steps S303 to S306 of FIG. 12, and each height position H1 to H5 detected by the height position detector 71 at each flow rate G1 to G5 shown in FIG. 13 is acquired and stored in the memory 62.

If a determination of YES is made in step S305 of FIG. 12, the height position detection step is ended, and the process proceeds to step S307 of FIG. 12 to start the adjustment step.

In step S307 of FIG. 12, the CPU 61 resets the counter N to 1.

The process proceeds to step S308 of FIG. 12, in which the first height position H1 is read from the memory 62. Next, the process proceeds to step S309 of FIG. 12, in which the reference height position HS1 at the flow rate G1 is calculated with reference to the characteristic curve p stored in the memory 62. Here, as shown in FIG. 13, the reference height position HS1 corresponds to the tension TS1 applied to the wire 18. The CPU 61 calculates the ratio α1 between the first height position H1 and the first reference height position HS1. Here, α1=HS1/H1. The process proceeds to step S310 of FIG. 12, in which the first flow rate G1 is corrected, and the flow rate (G1×α1) after correction is calculated and stored in the memory 62. The CPU 61 proceeds to step S311 of FIG. 12, in which it is determined whether the counter N has reached the final value Nend. If the CPU 61 makes a determination of NO in step S311 of FIG. 12, the CPU 61 increments the counter N by 1 in step S312 of FIG. 12, and returns to step S308 of FIG. 12. In step S309, the second height position H2 is read from the memory 62, and the second reference height position HS2 is calculated with reference to the characteristic curve p stored in the memory 62. Here, as shown in FIG. 13, the reference height position HS2 corresponds to the tension TS2 applied to the wire 18. The CPU 61 calculates a ratio α2=HS2/H2 between the second height position H2 and the second reference height position HS2. In step S310, the second flow rate G2 is corrected, and the flow rate (G2×α2) after correction is calculated and stored in the memory 62.

Hereinafter, similarly, the CPU 61 reads the N-th height position Hn from the memory 62, calculates the N-th ratio αn=HSn/Hn with reference to the characteristic curve p stored in the memory 62, corrects the N-th flow rate Gn, and sequentially stores the flow rate (Gn×αn) after correction in the memory 62. When the counter N reaches Nend (in this example, Nend=5), the CPU 61 makes a determination of YES in step S311 of FIG. 12, and proceeds to step S313 of FIG. 12.

In step S313 of FIG. 12, the CPU 61 reads each reference height position HSn of the tip 14f of the bonding arm 14 with respect to each corrected flow rate (Gn×αn). The CPU 61 generates the approximation curve q passing through the read coordinates [(Gn×αn), HSn] (n=1 to 5). As shown in FIG. 11, the approximation curve q is a curve indicating the height position H of the tip 14f of the bonding arm 14 from the neutral position H0 in the height direction with respect to the flow rate G of the air supplied to the wire tensioner 40.

As described in Equation 5 above, since the tension T is proportional to the height position H, if tension Ta is applied to the wire 18 by the wire tensioner 40, by multiplying the tension Ta by a proportionality coefficient and converting it into a height position Ha, and calculating a flow rate Ga of the air supplied to the wire tensioner 40 based on the approximation curve q shown in FIG. 13, the tension T of the wire 18 can be adjusted to the tension Ta.

In step S314 of FIG. 12, when the tension Ta is input from the outside, as shown in FIG. 13, the CPU 61 multiplies the tension Ta by the proportionality coefficient and converts it into the height position Ha, and calculates the flow rate Ga of the air supplied to the wire tensioner 40 based on the approximation curve q. While the flow rate G of the air is detected by the air flow detector 72 shown in FIG. 1, the air flow regulating valve 73 is operated to adjust the flow rate G of the air supplied to the wire tensioner 40 to the flow rate Ga. Accordingly, the wire tension adjuster 60 is able to adjust the tension T applied to the wire 18 to the input tension Ta.

In this way, in the second operation, since the approximation curve q defining the height position H of the tip 14f of the bonding arm 14 with respect to the flow rate G of the air supplied to the wire tensioner 40 is generated, and the tension T of the wire 18 is adjusted based on the approximation curve q generated, the tension T of the wire 18 required for bonding can be set according to a diameter, material or the like of the wire 18.

The approximation curve q may be a polygonal line connecting each coordinate of [(Gn×αn), HSn] (n=1 to 5) with a straight line.

Figure 14:
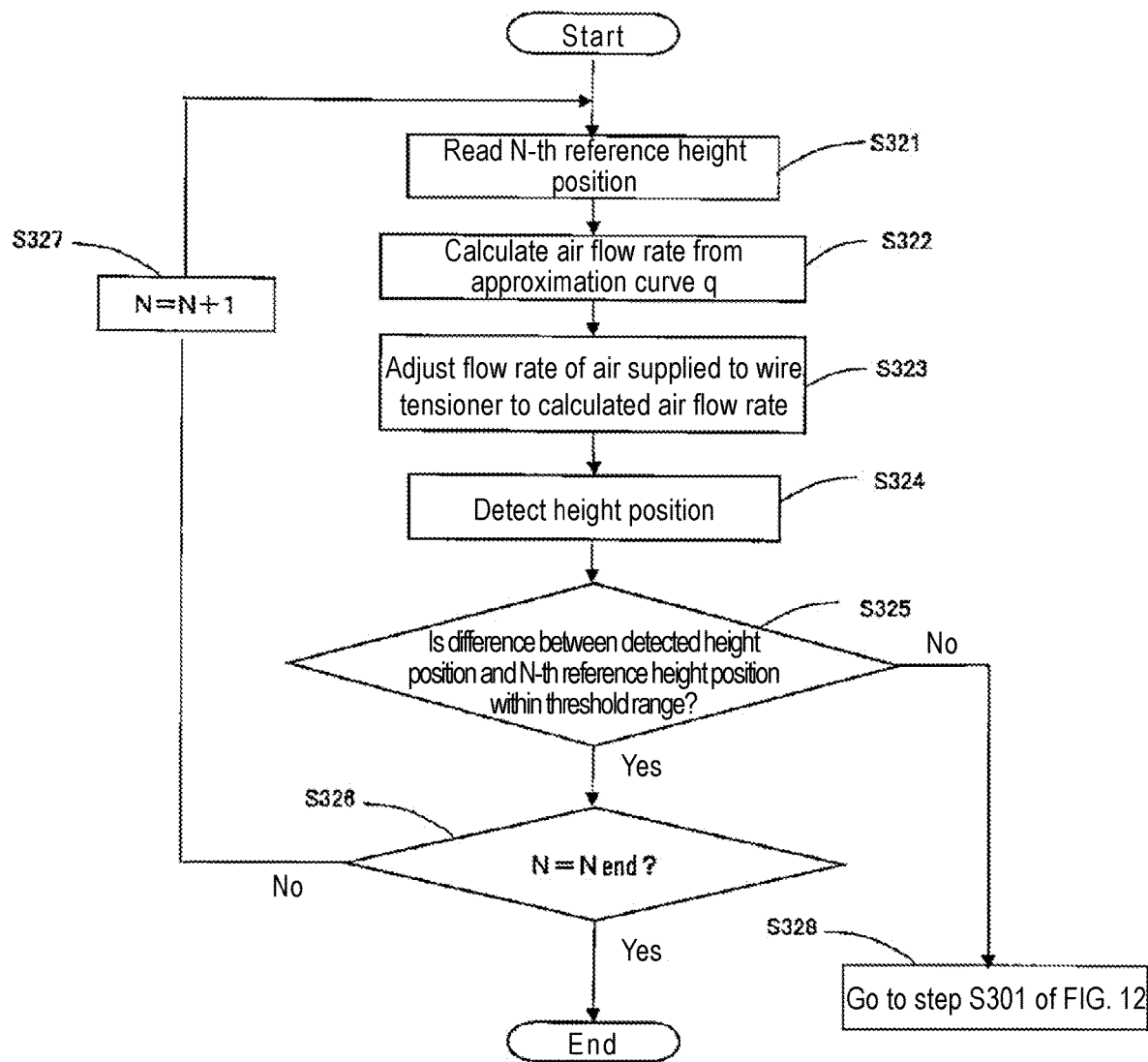
FIG. 14 is a flowchart showing an approximation curve checking operation of a wire tension adjuster according to an embodiment.

After generating the approximation curve q in step S313 of FIG. 12, the CPU 61 may perform a checking operation on the approximation curve q, as shown in FIG. 14.

As shown in step S321 of FIG. 14, the CPU 61 reads the N-th reference height position HSn from the memory 62. The process proceeds to step S322 of FIG. 14, in which a flow rate Gan corresponding to the reference height position HSn is calculated based on the approximation curve q generated. In step S323, while detecting the flow rate G of the air by the air flow detector 72 shown in FIG. 1, the CPU 61 operates the air flow regulating valve 73 to adjust the flow rate G of the air supplied to the wire tensioner 40 to the flow rate Gan. The CPU 61 proceeds to step S324 of FIG. 14, in which the height position Hn of the tip 14f of the bonding arm 14 from the neutral position H0 in the height direction is detected by the height position detector 71 shown in FIG. 1.

The CPU 61 proceeds to step S325 of FIG. 14, in which a difference between the height position Hn detected and the reference height position HSn is calculated, and it is determined whether the calculated difference is within the threshold range described with reference to FIG. 11. If a determination of YES is made in step S325 of FIG. 14, the process proceeds to step S326 of FIG. 14, in which it is determined whether N is equal to Nend. If a determination of NO is made in step S326, the process returns to step S321 of FIG. 14, and steps S321 to S327 of FIG. 14 are repeatedly executed. If a determination of YES is made in step S326, the checking operation is ended.

On the other hand, if the CPU 61 makes a determination of NO in step S325 of FIG. 14, the CPU 61 may proceed to step S328 of FIG. 14 and jump to step S301 of FIG. 12, and may execute the height position detection step and the adjustment step again.

In this way, by performing the checking operation, accuracy of the approximation curve q can be improved, and the tension T applied to the wire 18 can be relatively accurately adjusted.

Next, a third operation of the wire tension adjuster 60 is described with reference FIG. 15 to FIG. 17. Steps similar to the first and second operations described above will be briefly described.

Figure 15:
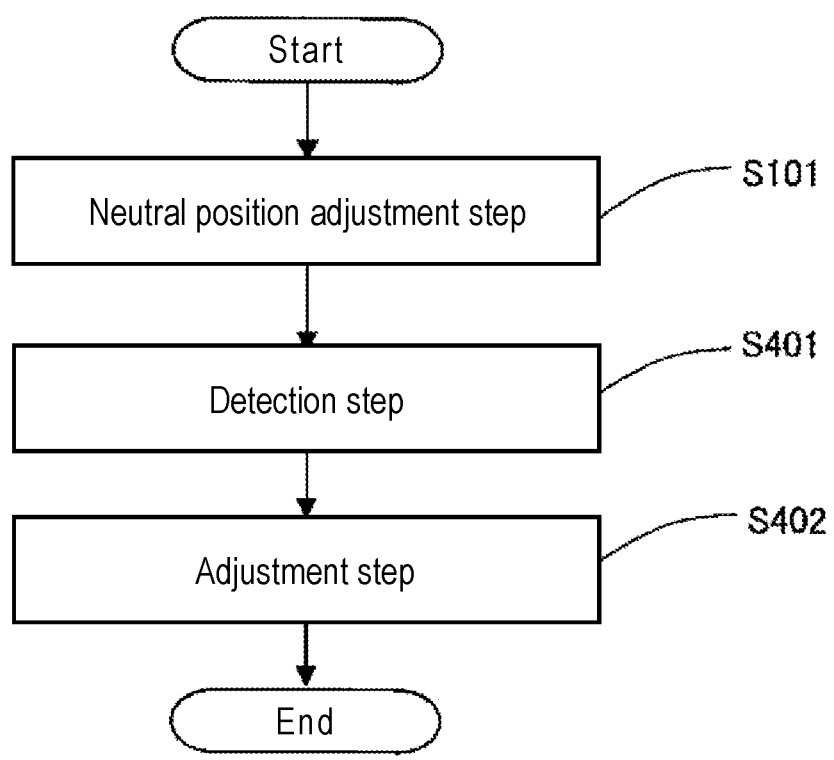
FIG. 15 is a flowchart showing a third operation of a wire tension adjuster according to an embodiment.

As shown in FIG. 15, the third operation includes the neutral position adjustment step shown in step S101, the detection step in step S401, and the adjustment step in step S402. Since the neutral position adjustment step is the same as the neutral position adjustment step described above with reference to FIG. 9, the description thereof is omitted.

In the detection step, in the state in which the wire 18 is gripped by the wire clamper 17, while the flow rate G of the air supplied to the wire tensioner 40 is changed, a plurality of height positions H of the tip 14f of the bonding arm 14 and a plurality of flow rates G of the air are detected. In the adjustment step, an approximation curve r defining each height position HSn of the tip 14f of the bonding arm 14 with respect to each flow rate GSn detected is generated, and the tension T applied to the wire 18 is adjusted based on the approximation curve r generated.

Next, the detection step and the adjustment step of the third operation are described in detail with reference to FIG. 16 and FIG. 17. Steps S501 to S508 of FIG. 16 indicate the detection step, and steps S509 to S510 of FIG. 16 indicate the adjustment step. In the following description, a case of detecting five flow rates GS1 to GS5 serving as five reference height positions HS1 to HS5 is described. In this case, Nend is 5 as in the second operation described above. The plurality of reference height positions HS1 to HS5 can be freely set. Here, as shown in FIG. 17, the plurality of reference height positions HS1 to HS5 correspond to the tension TS1 to the tension TS5 applied to the wire 18.

Figure 16:
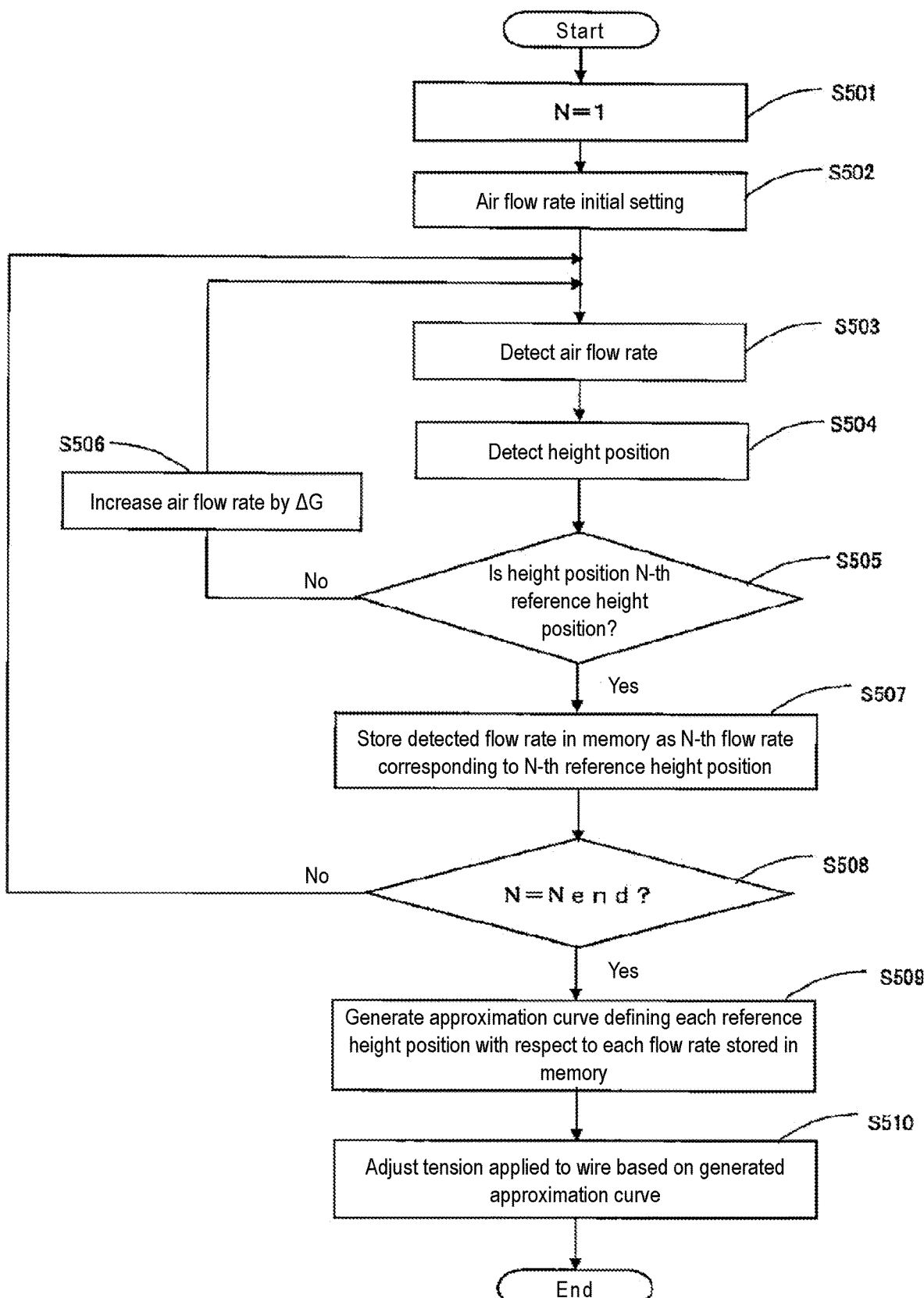
FIG. 16 is a flowchart showing details of the third operation shown in FIG. 15.

The CPU 61 sets the counter N to the initial value 1 in step S501 of FIG. 16, and sets the flow rate G of the air to an initial value in step S502. The initial value can be set freely. For example, in the case of detecting the five flow rates GS1 to GS5 serving as the five reference height positions HS1 to HS5 as shown in FIG. 17, the initial value may be freely set between 0 and GS1.

The CPU 61 detects the flow rate G of the air by the air flow detector 72 as shown in step S503 of FIG. 16, and detects the height position H of the tip 14f of the bonding arm 14 from the neutral position H0 in the height direction by the height position detector 71 as shown in step S504. It is determined in step S505 of FIG. 16 whether the height position H detected matches the first reference height position HS1. Here, as shown in FIG. 17, the reference height position HS1 corresponds to the tension TS1 applied to the wire 18.

If the CPU 61 makes a determination of NO in step S505 of FIG. 16, the CPU 61 proceeds to step S506 of FIG. 16, in which the flow rate G of the air is increased by ΔG, and the process returns to step S503 of FIG. 16. In steps S503 and S504, the flow rate G of the air and the height position H of the tip 14f of the bonding arm 14 are detected.

In this way, until the height position H of the tip 14f of the bonding arm 14 detected by the height position detector 71 reaches the first reference height position HS1, the CPU 61 repeatedly executes steps S503 to S506 of FIG. 16, and the flow rate G of the air and the height position H are detected while the flow rate G of the air is increased by ΔG each time.

In step S505 of FIG. 16, when the CPU 61 determines that the height position H detected by the height position detector 71 matches the first reference height position HS1 and makes a determination of YES in step S505, the CPU 61 proceeds to step S507 of FIG. 16, in which the flow rate G of the air at that time is stored in the memory 62 as the first flow rate GS1 corresponding to the first reference height position HS1.

The CPU 61 proceeds to step S508 of FIG. 16, in which it is determined whether the counter N has reached Nend. If a determination of NO is made in step S508, the process returns to step S503 of FIG. 16, and the flow rate G of the air is increased by ΔG each time until the height position H detected by the height position detector 71 reaches the second reference height position HS2. If a determination of YES is made in S505 of FIG. 16, in step S507 of FIG. 16, the flow rate G at that time is stored in the memory 62 as the second flow rate GS2 corresponding to the second reference height position HS2. Here, the reference height position HS2 corresponds to the tension TS2 applied to the wire 18.

Hereinafter, similarly, the CPU 61 increases the flow rate G of the air by ΔG each time, detects the flow rate G of the air and the height position H, and stores the N-th flow rate GSn corresponding to the N-th reference height position HSn in the memory 62.

If a determination of YES is made in step S508 shown in FIG. 16, the detection step is ended, and the process proceeds to step S509 of FIG. 16 to start the adjustment step.

In step S509 of FIG. 16, the CPU 61 reads the N-th flow rate GSn (n=1 to 5) stored in the memory 62 that corresponds to the N-th reference height position HSn. Like the second operation described above, the CPU 61 generates the approximation curve r passing through the read coordinates [GSn, HSn] (n=1 to 5). The approximation curve r is a curve indicating the height position H of the tip 14$f$ of the bonding arm 14 from the neutral position H0 in the height direction with respect to the flow rate G of the air supplied to the wire tensioner 40.

Figure 17:
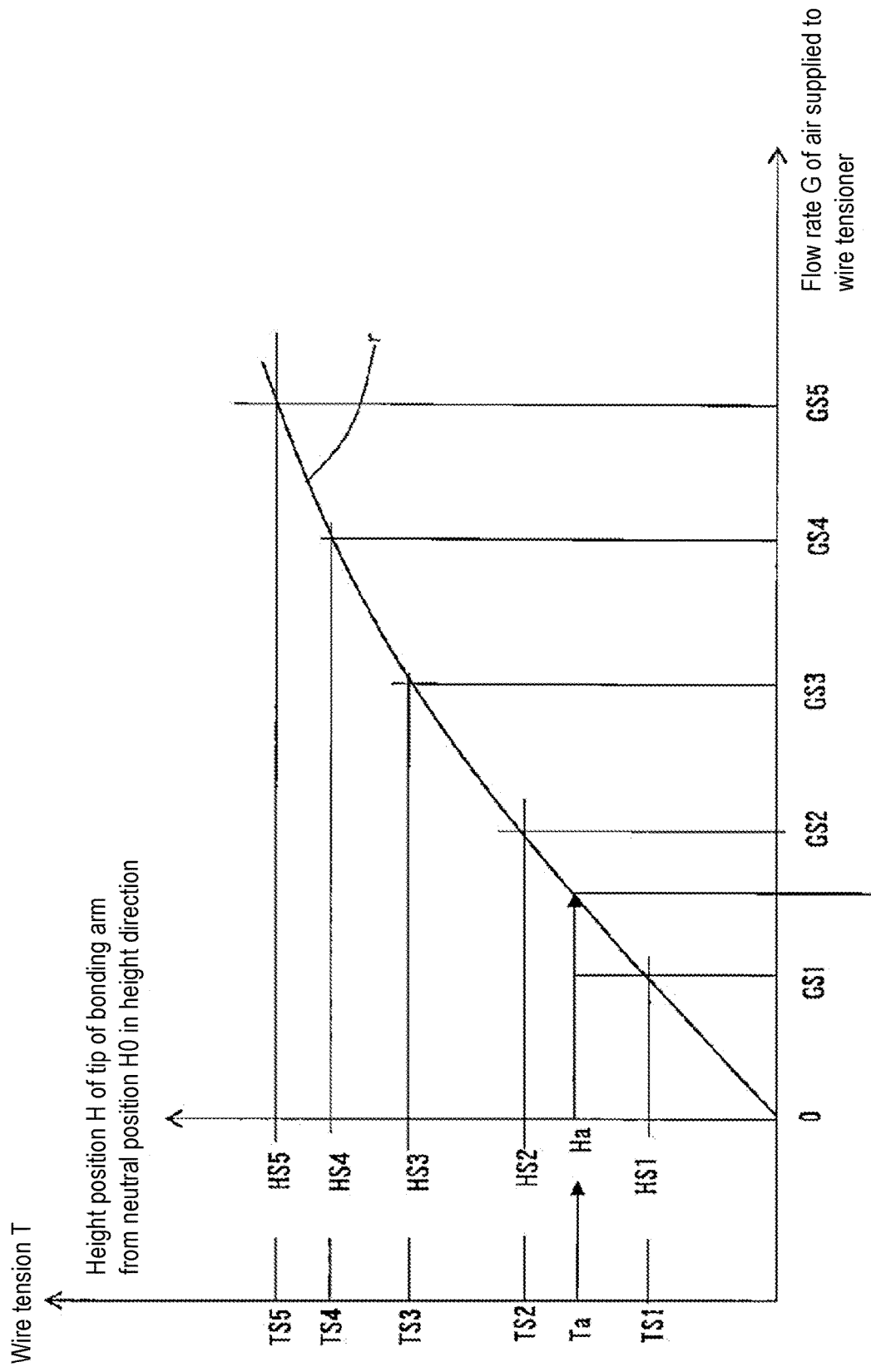
FIG. 17 is a graph showing a change in the height position H of a tip of a bonding arm from the neutral position H0 in a height direction and a change in the tension T applied to a wire with respect to the flow rate G of air supplied to a wire tensioner.

Like the second operation described above, in step S510 of FIG. 16, when the tension Ta is input from the outside, as shown in FIG. 17, the CPU 61 multiplies the tension Ta by the proportionality coefficient and converts it into the height position Ha, and calculates the flow rate Ga of the air based on the approximation curve r. While the flow rate G of the air is detected by the air flow detector 72 shown in FIG. 1, the air flow regulating valve 73 is operated to adjust the flow rate G of the air supplied to the wire tensioner 40 to the flow rate Ga. Accordingly, the wire tension adjuster 60 is able to adjust the tension T applied to the wire 18 to the input tension Ta.

In this way, in the third operation, since the flow rate G of the air supplied to the wire tensioner 40 and the height position H of the tip 14$f$ of the bonding arm 14 are detected at the same time, and the approximation curve r defining the height position H of the tip 14$f$ of the bonding arm 14 with respect to the flow rate G of the air supplied to the wire tensioner 40 is generated, the approximation curve r can be easily generated. Since the tension T of the wire 18 is adjusted based on the approximation curve r generated, the tension T of the wire 18 required for bonding can be set according to a diameter, material or the like of the wire 18.

After generating the approximation curve r in step S509 of FIG. 16, as shown in FIG. 14, the CPU 61 performs the checking operation on the approximation curve r and calculates the difference between the height position Hn detected and the reference height position HSn. If the calculated difference is not within the threshold range described with reference to FIG. 11, the process may return to step S501 of FIG. 16 so that the detection step and the adjustment step may be executed again. Accordingly, accuracy of the approximation curve r can be improved.

As described above, in the wire tension adjuster 60 according to an embodiment, since the height position H of the tip 14$f$ of the bonding arm 14 is detected, the flow rate G of the air supplied to the wire tensioner 40 is adjusted based on the height position H detected, and the tension T applied to the wire 18 is adjusted, the tension T applied to the wire 18 can be easily adjusted in the state in which the wire tensioner 40 has been incorporated into the wire bonding apparatus 100.

The approximation curve r may be a polygonal line connecting each coordinate of [GSn, HSn] (n=1 to 5) with a straight line.

In the example of the third operation described above, it has been described that a plurality of flow rate GSn corresponding to a plurality of reference height positions HSn of the tip 14$f$ of the bonding arm 14 are detected while the flow rate G of the air supplied to the wire tensioner 40 is changed. However, the present invention is not limited thereto if a plurality of sets of flow rates G of air corresponding to the height position H can be detected. For example, the flow rate G of the air may be increased at a constant rate, the flow rate G of the air and the height position H may be detected a plurality of times at predetermined time intervals, and the approximation curve r defining the height position H of the tip 14$f$ of the bonding arm 14 with respect to the flow rate G of the air supplied to the wire tensioner 40 may be generated based on a plurality of sets of detected flow rates G and height positions H.

In the above description, it has been described that the bonding arm 14 is rotatably fixed to the bonding head 12 by the cross leaf spring 20. However, the bonding arm 14 may be rotatably attached to the bonding head 12 by a spring member that generates the rotational moment M1 in a direction opposite to the rotation direction, and the spring member is not limited to the cross leaf spring 20. For example, the bonding arm 14 may be attached to the bonding head 12 so as to be rotatable about a rotating shaft, and a coil spring may be fitted around an outer circumference of the rotating shaft and may be configured to have one end fixed to the bonding arm 14 and the other end fixed to the bonding head 12. Furthermore, a leaf spring or a torsion coil spring may be applied to rotatably hold the bonding arm 14.

In the above description, it has been described that the CPU 61 of the wire tension adjuster 60 executes each step of FIGS. 9, 10, 12 and 14 to 16. However, the present invention is not limited thereto, and each step may be manually executed. Executing each step of FIGS. 9, 10, 12, and 14 to 16 by the CPU 61 of the wire tension adjuster 60 or manually is also an embodiment of a wire tension adjustment method.

The invention claimed is:

1. A wire tension adjustment method, for adjusting tension applied to a wire of a wire bonding apparatus, the wire bonding apparatus comprising:
   a bonding arm, rotatably attached to a bonding head and having a tip movable in an up-down direction;
   a wire clamper, attached to the bonding arm, gripping and releasing the wire inserted through a bonding tool held by the tip;
   a wire tensioner, applying tension to the wire by an airflow;

an air flow detector, detecting a flow rate of air supplied to the wire tensioner;

a height position detector, detecting a height position of the tip of the bonding arm; and a spring member, generating a rotational moment in a direction opposite to a rotation direction of the bonding arm, wherein the wire tension adjustment method comprises:

a height position detection step, in which air is supplied to the wire tensioner in a state in which the wire is gripped by the wire clamper, and the height position of the tip of the bonding arm where a rotational moment in the rotation direction of the bonding arm due to tension of the wire and the rotational moment in the direction opposite to the rotation direction of the bonding arm due to the spring member balance each other is detected by the height position detector; and an adjustment step, in which, by adjusting the flow rate of the air supplied to the wire tensioner based on the height position detected, the tension applied to the wire is adjusted.

2. The wire tension adjustment method according to claim 1, wherein, in the height position detection step, the height position of the tip of the bonding arm is detected using the flow rate of the air supplied to the wire tensioner as a reference air flow rate; and in the adjustment step, based on a ratio between the height position detected of the tip of the bonding arm and a reference height position of the tip of the bonding arm, the flow rate of the air supplied to the wire tensioner is corrected, and the tension applied to the wire is adjusted.

3. The wire tension adjustment method according to claim 2, wherein, after the adjustment step, air at a corrected flow rate is supplied to the wire tensioner and the height position detection step is executed, and in response to a difference between the height position detected of the tip of the bonding arm and the reference height position exceeding a threshold range, the height position detection step and the adjustment step are executed again.

4. The wire tension adjustment method according to claim 1, wherein, in the height position detection step, the height position of the tip of the bonding arm is detected a plurality of times at a plurality of flow rates of the air supplied to the wire tensioner;

in the adjustment step, each ratio between each of the height position of the tip of the bonding arm detected at each flow rate and each reference height position of the tip of the bonding arm at each flow rate is calculated;

each flow rate of the air supplied to the wire tensioner is corrected based on each of the ratio calculated, and an approximation curve defining each of the reference height position of the tip of the bonding arm with respect to each flow rate corrected is generated; and the tension applied to the wire is adjusted based on the approximation curve generated.

5. The wire tension adjustment method according to claim 4, wherein, air at each flow rate corrected is supplied to the wire tensioner and each of the height position of the tip of the bonding arm is detected, and in response to a difference between each of the height position detected at each flow rate and each of the reference height position at each flow rate exceeding each threshold range, the height position detection step and the adjustment step are executed again.

6. A wire tension adjustment method, for adjusting tension applied to a wire of a wire bonding apparatus, the wire bonding apparatus comprising:

a bonding arm, rotatably attached to a bonding head and having a tip movable in an up-down direction;

a wire clamper, attached to the bonding arm, gripping and releasing the wire inserted through a bonding tool held by the tip;

a wire tensioner, applying tension to the wire by an airflow;

an air flow detector, detecting a flow rate of air supplied to the wire tensioner;

a height position detector, detecting a height position of the tip of the bonding arm; and a spring member, generating a rotational moment in a direction opposite to a rotation direction of the bonding arm, wherein the wire tension adjustment method comprises:

a detection step, in which, in a state in which the wire is gripped by the wire clamper, while the flow rate of the air supplied to the wire tensioner is changed, a plurality of the height positions of the tip of the bonding arm where a rotational moment in the rotation direction of the bonding arm due to tension of the wire and the rotational moment in the direction opposite to the rotation direction of the bonding arm due to the spring member balance each other and a plurality of flow rates of air are detected by the height position detector and the air flow detector; and an adjustment step, in which an approximation curve defining each of the height position detected of the tip of the bonding arm with respect to each flow rate detected is generated, and the tension applied to the wire is adjusted based on the approximation curve generated.

7. The wire tension adjustment method according to claim 6, wherein the spring member is a cross leaf spring in which two spring plates intersect in a cross shape, and the bonding arm is attached to the bonding head so as to be rotatable about an axis along a line of intersection of the two spring plates.

8. A wire tension adjuster, used in a wire bonding apparatus and adjusting tension applied to a wire, the wire bonding apparatus comprising:

a bonding arm, rotatably attached to a bonding head and having a tip movable in an up-down direction;

a wire clamper, attached to the bonding arm, gripping and releasing the wire inserted through a bonding tool held by the tip;

a wire tensioner, applying tension to the wire by an airflow;

an air flow detector, detecting a flow rate of air supplied to the wire tensioner;

a height position detector, detecting a height position of the tip of the bonding arm; and a spring member, generating a rotational moment in a direction opposite to a rotation direction of the bonding arm, wherein, in the wire tension adjuster, air is supplied to the wire tensioner in a state in which the wire is gripped by the wire clamper, and the height position of the tip of the bonding arm where a rotational moment in the rotation direction of the bonding arm due to tension of the wire and the rotational moment in the direction opposite to the rotation direction of the bonding arm due to the spring member balance each other is detected by the height position detector; and by adjusting the flow rate of the air supplied to the wire tensioner based on the height position detected, the tension applied to the wire is adjusted.

9. The wire tension adjuster according to claim 8, wherein the height position of the tip of the bonding arm is detected by the height position detector using the flow rate of the air supplied to the wire tensioner as a reference air flow rate; and based on a ratio between the height position detected of the tip of the bonding arm and a reference height position of the tip of the bonding arm, the flow rate of the air supplied to the wire tensioner is corrected, and the tension applied to the wire is adjusted.

10. The wire tension adjuster according to claim 9, wherein the height position of the tip of the bonding arm is detected a plurality of times by the height position detector at a plurality of flow rates of the air supplied to the wire tensioner that are detected by the air flow detector;

each ratio between each of the height position of the tip of the bonding arm detected at each flow rate and each of the reference height position of the tip of the bonding arm at each flow rate is calculated;

each flow rate of the air supplied to the wire tensioner is corrected based on each of the ratio calculated, and an approximation curve defining each of the reference height position of the tip of the bonding arm with respect to each flow rate corrected is generated; and the tension applied to the wire is adjusted based on the approximation curve generated.

11. A wire tension adjuster, used in a wire bonding apparatus and adjusting tension applied to a wire, the wire bonding apparatus comprising:

a bonding arm, rotatably attached to a bonding head and having a tip movable in an up-down direction;

a wire clamper, attached to the bonding arm, gripping and releasing the wire inserted through a bonding tool held by the tip;

a wire tensioner, applying tension to the wire by an airflow;

an air flow detector, detecting a flow rate of air supplied to the wire tensioner;

a height position detector, detecting a height position of the tip of the bonding arm; and a spring member, generating a rotational moment in a direction opposite to a rotation direction of the bonding arm, wherein, in the wire tension adjuster, in a state in which the wire is gripped by the wire clamper, while the flow rate of the air supplied to the wire tensioner is changed, a plurality of the height positions of the tip of the bonding arm where a rotational moment in the rotation direction of the bonding arm due to tension of the wire and the rotational moment in the direction opposite to the rotation direction of the bonding arm due to the spring member balance each other are detected by the height position detector, and a plurality of flow rates of the air supplied to the wire tensioner are detected by the air flow detector; and an approximation curve defining each of the height position detected of the tip of the bonding arm with respect to each flow rate detected is generated, and the tension applied to the wire is adjusted based on the approximation curve generated.

12. The wire tension adjuster according to claim 11, wherein the spring member of the wire bonding apparatus is a cross leaf spring in which two spring plates intersect in a cross shape, and the bonding arm is attached to the bonding head so as to be rotatable about an axis along a line of intersection of the two spring plates.

13. The wire tension adjustment method according to claim 1, wherein the spring member is a cross leaf spring in which two spring plates intersect in a cross shape, and the bonding arm is attached to the bonding head so as to be rotatable about an axis along a line of intersection of the two spring plates.

14. The wire tension adjuster according to claim 8, wherein the spring member of the wire bonding apparatus is a cross leaf spring in which two spring plates intersect in a cross shape, and the bonding arm is attached to the bonding head so as to be rotatable about an axis along a line of intersection of the two spring plates.

* * * * *